US006869738B2

(12) United States Patent
Oshima et al.

(10) Patent No.: US 6,869,738 B2
(45) Date of Patent: Mar. 22, 2005

(54) MASK PATTERN CORRECTION METHOD

(75) Inventors: Katsuo Oshima, Kanagawa (JP); Koki Muto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 140 days.

(21) Appl. No.: 10/305,098

(22) Filed: Nov. 27, 2002

(65) Prior Publication Data

US 2003/0162103 A1 Aug. 28, 2003

(30) Foreign Application Priority Data

Feb. 28, 2002 (JP) ........................................ 2002-053378

(51) Int. Cl.[7] ................................................. G03F 9/00
(52) U.S. Cl. ........................................... 430/30; 430/5
(58) Field of Search .................................... 430/30, 5

(56) References Cited

U.S. PATENT DOCUMENTS

| 5,723,233 A | 3/1998 | Garza et al. |
| 5,879,844 A | 3/1999 | Yamamoto et al. |
| 5,991,006 A | 11/1999 | Tsudaka |
| 6,044,007 A | * 3/2000 | Capodieci .................... 365/120 |
| 6,168,891 B1 | 1/2001 | Shibata |
| 6,501,083 B1 | 12/2002 | Kamijo |

FOREIGN PATENT DOCUMENTS

| JP | 08-248614 | 9/1996 |
| JP | 09-034095 | 2/1997 |
| JP | 10133358 A | 5/1998 |
| JP | 2000-031021 | 1/2000 |
| JP | 2000-162758 | 6/2000 |
| JP | 2000-235251 | 8/2000 |
| JP | 2000-330258 | 11/2000 |
| JP | 2001-126980 | 5/2001 |

* cited by examiner

Primary Examiner—Mark E. Huff
Assistant Examiner—Saleha Mohamedulla
(74) Attorney, Agent, or Firm—Volentine Francos & Whitt, PLLC

(57) ABSTRACT

The main mask pattern of a photomask is corrected by adding serifs of one type (inner or outer) to a pair of mutually adjacent corners in the pattern, and adding a serif of the opposite type (outer or inner) to the edge between the corners. When the photomask is used to create a resist pattern by photolithography in the fabrication of a semiconductor device, the serifs combine to produce an optical proximity correction that reduces corner rounding and increases edge straightness in the resist pattern.

15 Claims, 26 Drawing Sheets

MASK PATTERN CORRECTION METHOD

BACKGROUND OF THE INVENTION

1. Field of the Invention

The present invention relates to a method of correcting the mask pattern of a photomask used in photolithography so as to obtain a desired resist pattern, to a photomask having the corrected mask pattern, to an exposure method using the photomask, and to a semiconductor device fabricated using the photomask.

2. Description of the Related Art

Photolithography is a fundamental integrated circuit fabrication technique that transfers a pattern from a photomask (often referred to as a reticle) to a layer of photoresist. The pattern is transferred by exposing the photoresist layer to light through the photomask, then developed to form a resist mask.

As integrated circuits reach ever-higher levels of integration, their shrinking internal dimensions, including both the sizes of circuit elements and the spacing between the circuit elements, pose problems for photolithography. One problem is the optical proximity effect (OPE), a general term for various phenomena that distort the mask pattern when it is transferred to the photoresist. For example, right-angled corners may become rounded, lines may become shortened at their ends, and line widths may be altered.

These optical proximity effects can seriously alter the electrical characteristics of highly integrated circuits. They also affect fabrication yields, by causing unintended metal lines to overlap, for example, leading to short circuits and device failure.

Known methods of compensating for optical proximity effects include the optical proximity corrections disclosed in U.S. Pat. No. 5,723,233 to Garza et al., and U.S. Pat. No. 5,879,844 to Yamamoto et al. These known methods include increasing the contrast of the exposure apparatus, expanding the process window, adding auxiliary patterns or serifs to the main mask pattern, and increasing or reducing the line widths in the main mask pattern.

The known corrective methods, however, fail to provide a simple correction scheme adequate to the needs of current high levels of integration. There is a need for further corrective schemes.

SUMMARY OF THE INVENTION

An object of the present invention is to provide a simple, effective method of correcting a main mask pattern used to create a resist pattern by photolithography.

A more particular object is to improve the corner morphology of the resist pattern.

In the invented method, first serifs are added to two adjacent corners of a part of the main mask pattern, and a second serif is added to an edge disposed between the two adjacent corners. The first and second serifs are of opposite type. If the part of the main mask pattern to which the serifs are added is a transparent part, the first serifs are inner serifs, increasing the transparent area, and the second serif is an outer serif, reducing the transparent area. If the part of the main mask pattern to which the serifs are added is an opaque part, the first serifs are outer serifs and the second serif is an inner serif.

The corners to which the first serifs are added are preferably interior corners with angles of less than one hundred eighty degrees, more preferably with angles of from forty-five to one hundred thirty-five degrees. The edge to which the second serif is added is preferably shorter than other edges adjacent to the two corners. The second serif is preferably a multi-step serif. The first serifs may also have multiple steps.

The two opposite types of serifs interact optically to improve the corner morphology of the resist pattern. In particular, corner rounding is reduced to a greater degree than by conventional methods.

If the part of the main mask pattern to which the serifs are added is an opaque part, and the edge to which the second serif is added faces a side of another opaque part of the pattern, an inner serif is preferably added to that side, facing the second serif. This inner serif prevents the side from bulging due to an optical proximity effect.

DETAILED DESCRIPTION OF THE INVENTION

Figure 1:
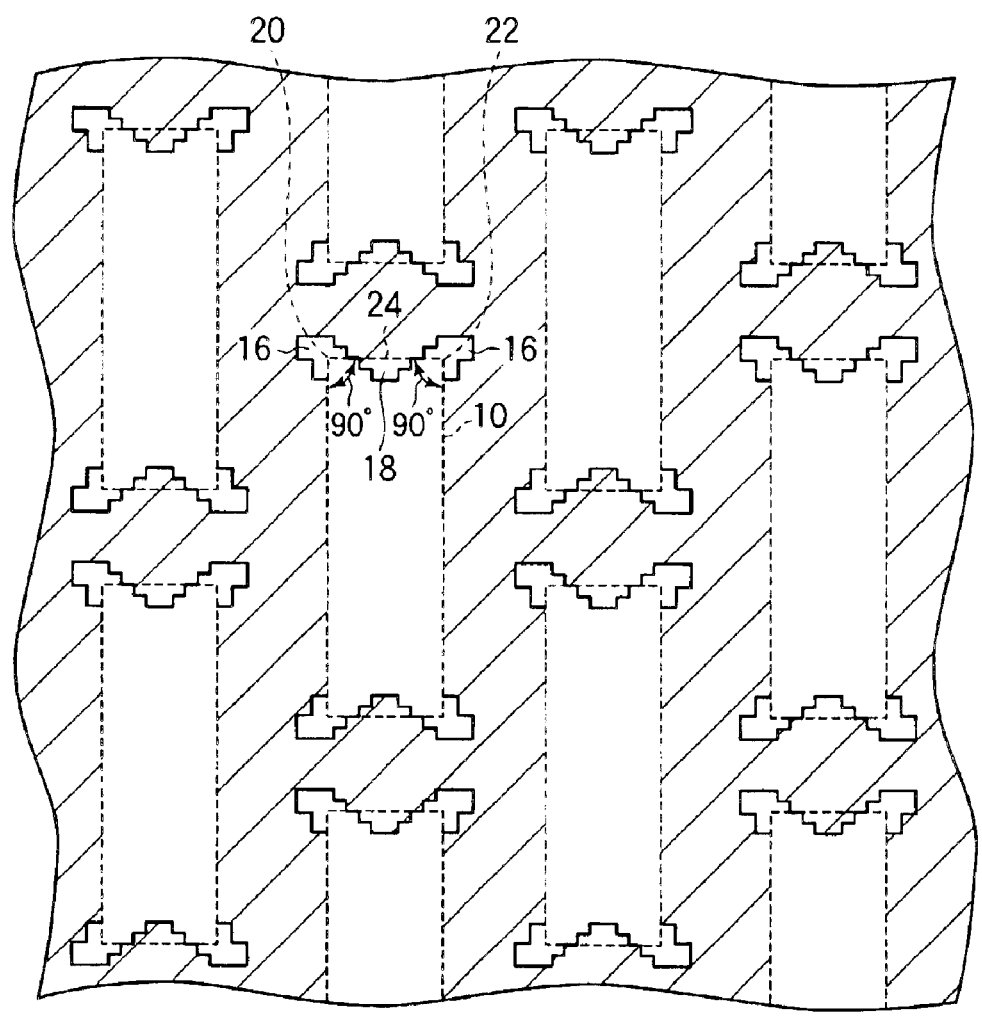
FIG. 1 is a plan view of a mask pattern illustrating a correction method according to a first embodiment of the invention.

Embodiments of the invention will now be described with reference to the attached drawings, in which like elements are indicated by like reference characters. Throughout the drawings, dashed lines will indicate an uncorrected main mask pattern, solid lines will indicate a mask pattern actually formed on a photomask, dash-dot lines with double dots will indicate a resist pattern, hatching will indicate opaque parts of the photomask, and white areas will indicate transparent parts of the photomask.

The terms 'main mask pattern', 'inner serif', and 'outer serif' will be used as follows. A main mask pattern is a pattern that defines the desired shape of a circuit element, line, or region. An outer serif is an extension of or addition to an opaque part of a main mask pattern. An inner serif is an indentation in or subtraction from an opaque part of the main mask pattern.

First Embodiment

Figure 2:
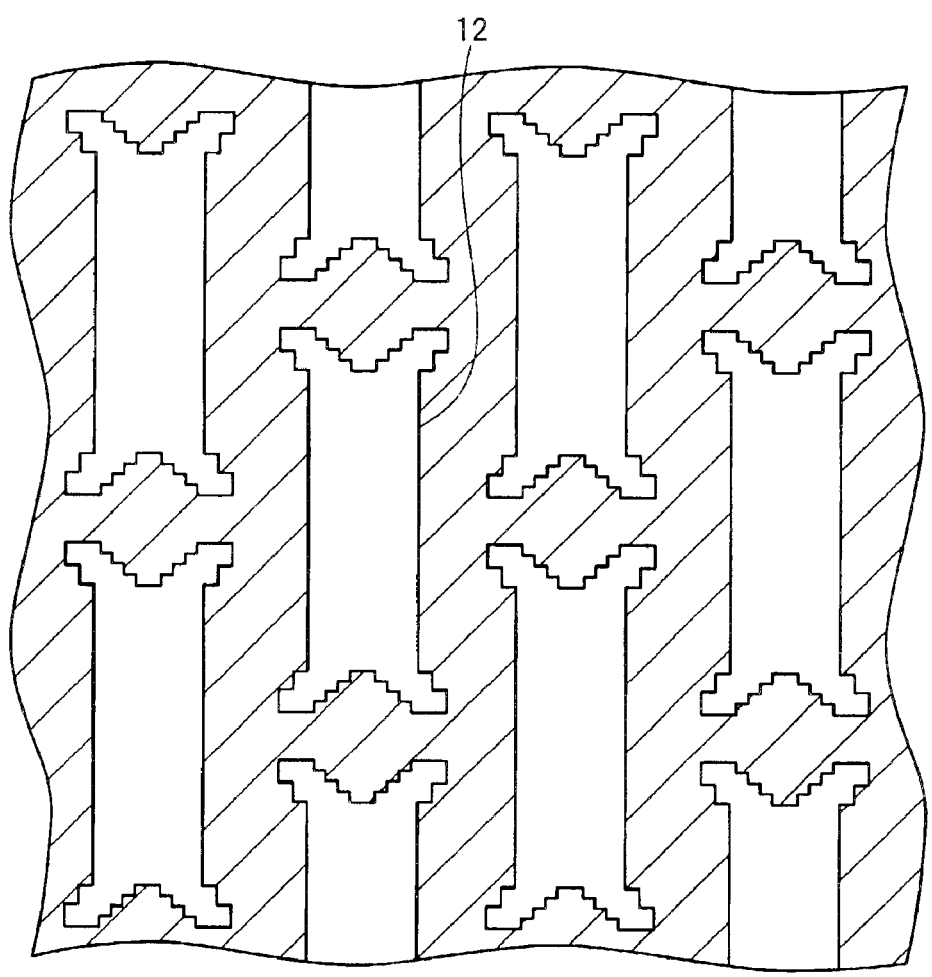
FIG. 2 is a plan view of the corrected mask pattern in FIG. 1.

The first embodiment will be described in relation to the fabrication of a semiconductor device such as a read-only memory (ROM), and more particularly in relation to a photomask used to define the active regions of the device. Referring to FIG. 1, the main mask pattern 10 is a pattern of transparent rectangular slits. In the first embodiment, inner serifs 16 are added at the corners 20, 22 of the rectangular slits, and outer serifs 18 are added at the ends 24 of the rectangular slits. More precisely, an outer serif 18 is added to each comparatively short edge 24 between adjacent corners 20, 22. The interior angle at the corners 20, 22 (the angle within the transparent area) is ninety degrees. The inner serif 16 and outer serif 18 have a stepped shape, each comprising two steps. The serifs 16, 18 alter the main mask pattern 10 to the corrected mask pattern 12 shown in FIG. 2.

Figure 3:
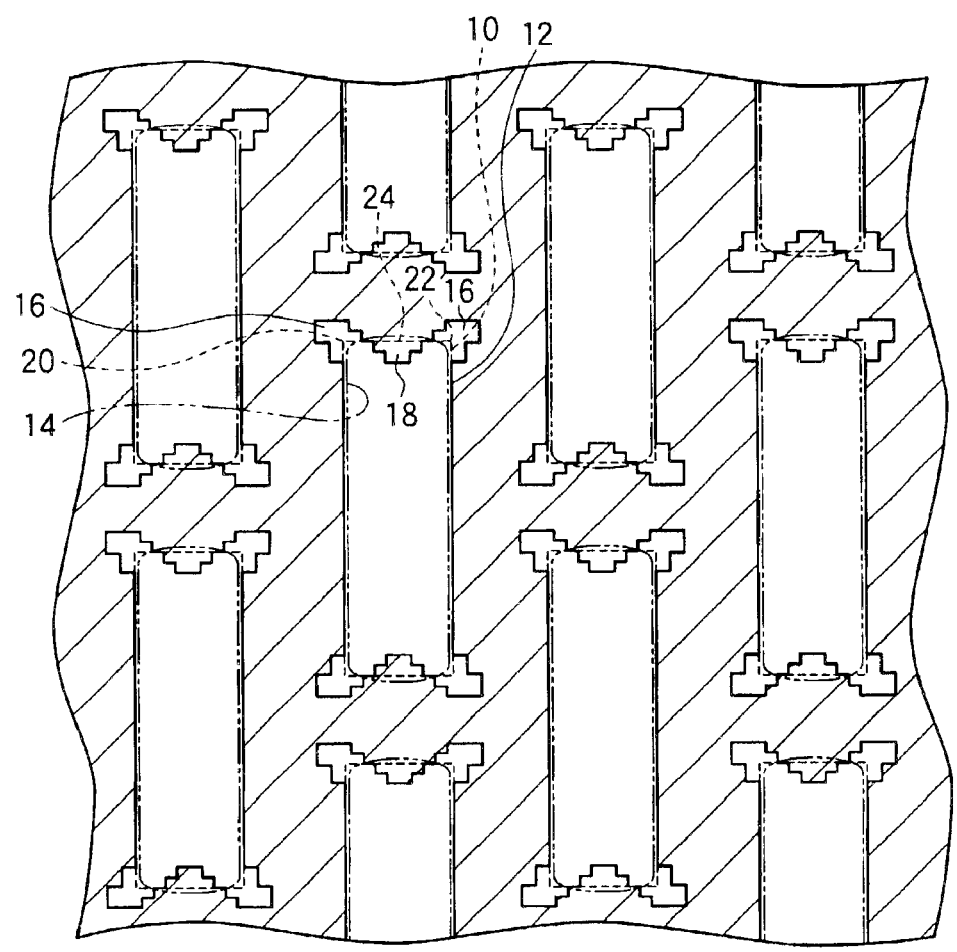
FIG. 3 is a plan view illustrating the transfer of the corrected mask pattern to a photoresist layer.
Figure 4:
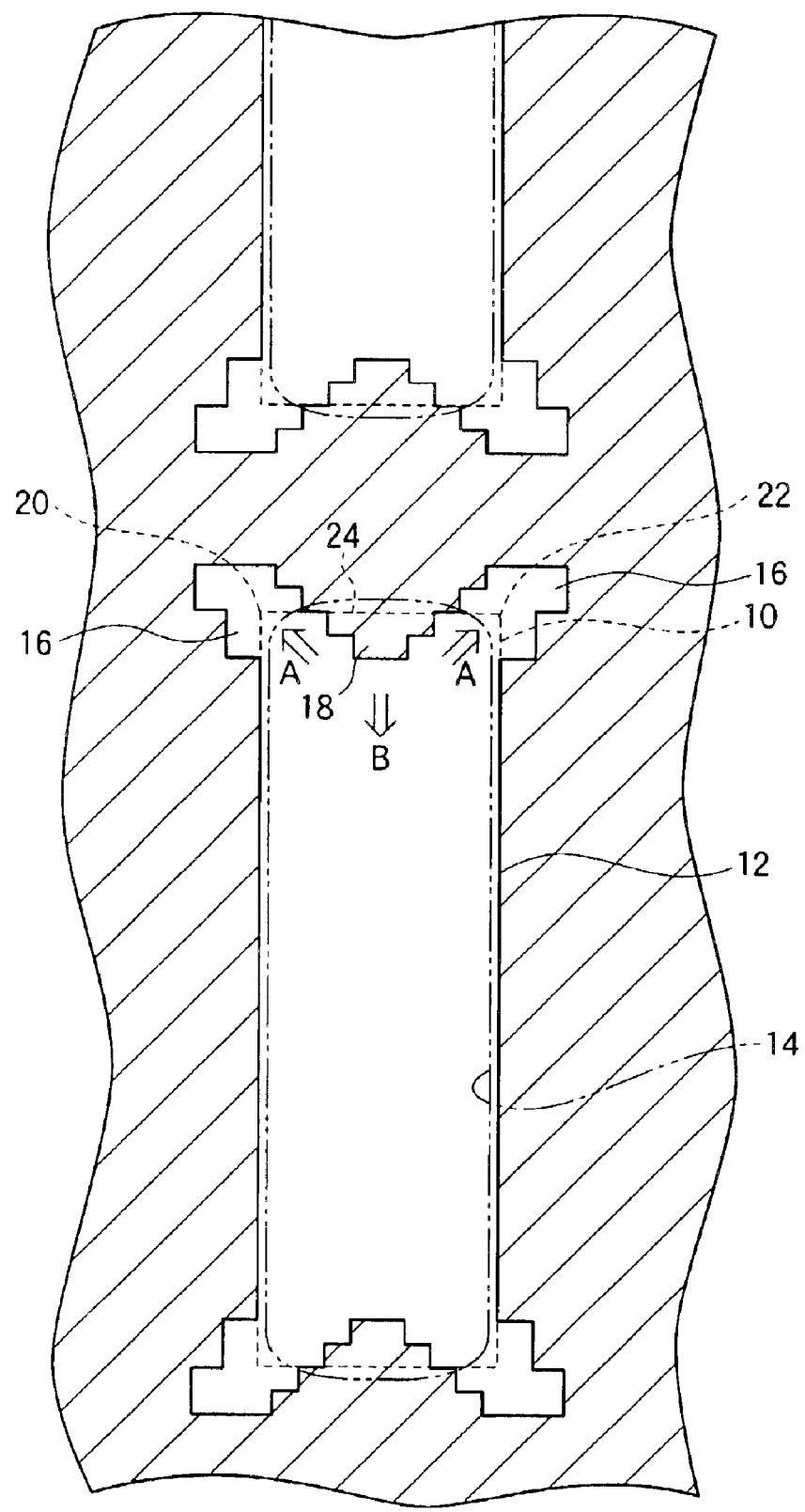
FIG. 4 is an enlarged plan view of part of FIG. 3.

Referring to FIGS. 3 and 4, when photolithography is performed using a photomask having the corrected mask pattern 12, the added serifs 16, 18 produce an optical proximity correction (OPC) that brings the resist pattern 14 into close agreement with the main mask pattern 10. Specifically, the inner serifs 16 move the corners of the resist pattern 14 outward in the direction of the arrows marked A in FIG. 4, toward the corners 20, 22 of the main mask pattern 10, and the outer serifs 18 move the short edges of the resist pattern 14 inward, in the direction of arrow B, toward the short edges 24 of the main mask pattern 10. Rounding of the resist at the corners 20, 22 is thereby reduced.

The two-step structure of the serifs 16, 18 operates as follows. The first step of each serif, which is disposed directly adjacent to the main mask pattern 10, corrects for the optical proximity effect (OPE) of the main mask pattern 10, but produces an optical proximity effect of its own. The second step of the serif corrects for the optical proximity effect of the first step, increasing the overall effectiveness of the correction.

Although at least two steps are preferable, the number of steps is not limited to two. The serifs 16, 18 may have three or more steps to achieve a still more effective optical proximity correction.

Figure 5:
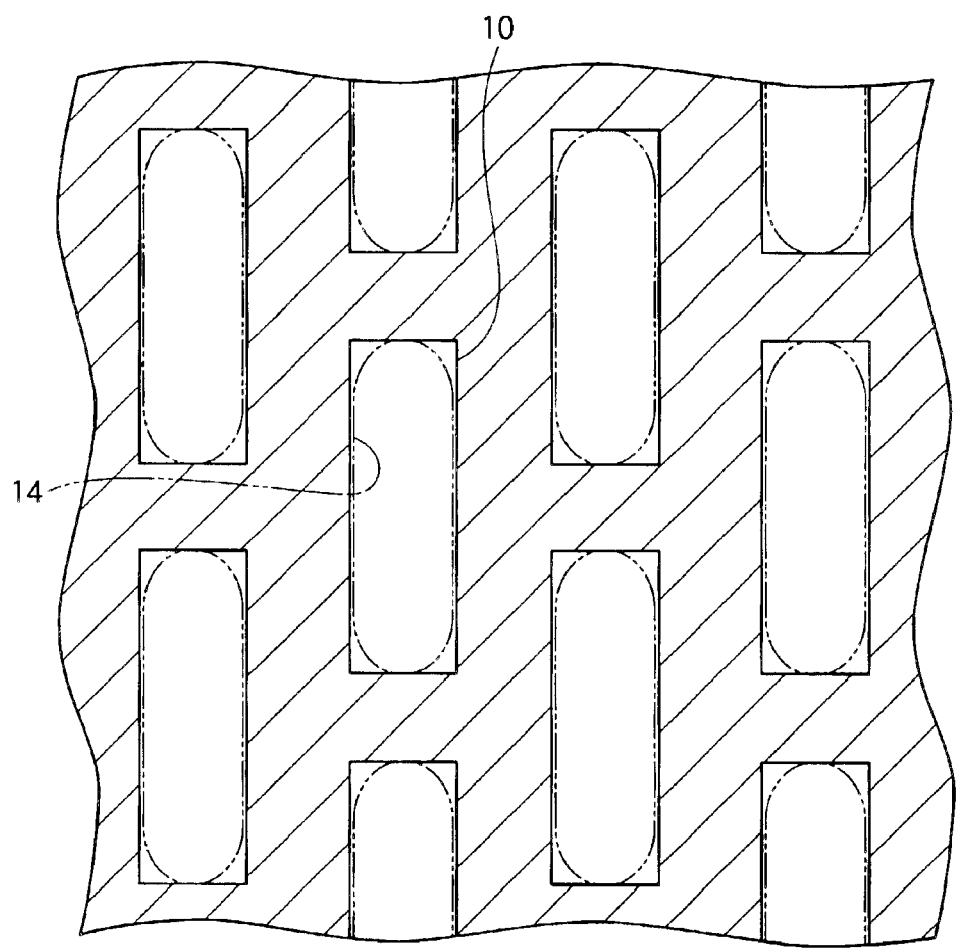
FIG. 5 is a plan view illustrating the transfer of the uncorrected main mask pattern to the photoresist layer.
Figure 6:
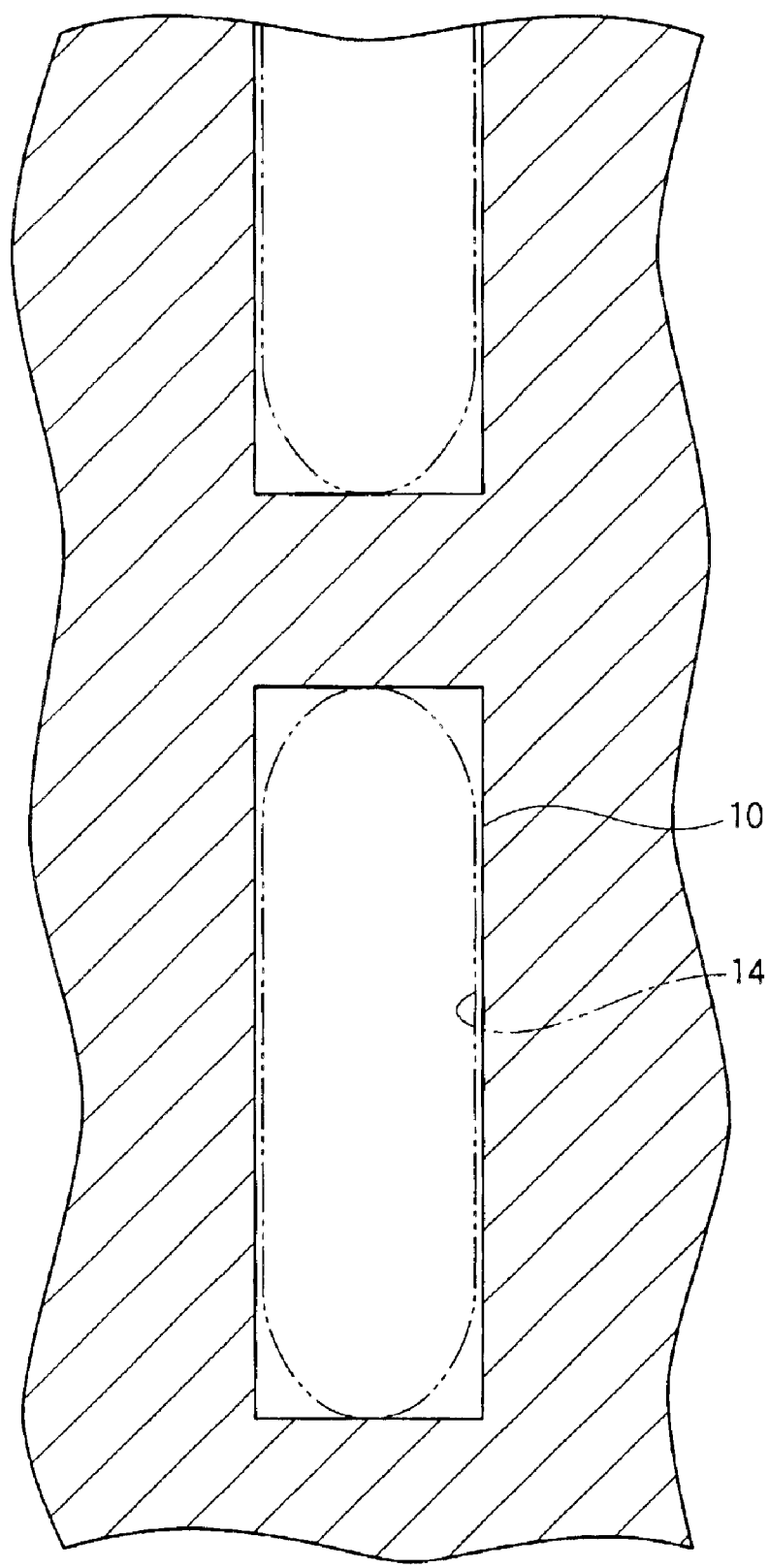
FIG. 6 is an enlarged plan view of part of FIG. 5.

FIGS. 5 and 6 show the resist pattern 14 that would be formed by use of the uncorrected main mask pattern 10, which is now indicated by solid lines. The resist pattern 14 is rounded at the ends, and the active regions formed using the resist pattern 14 will be smaller than intended. Compared with these regions, the active regions formed using the corrected mask 12 in the first embodiment will have the desired size and the desired rectangular shape.

Second Embodiment

Figure 7:
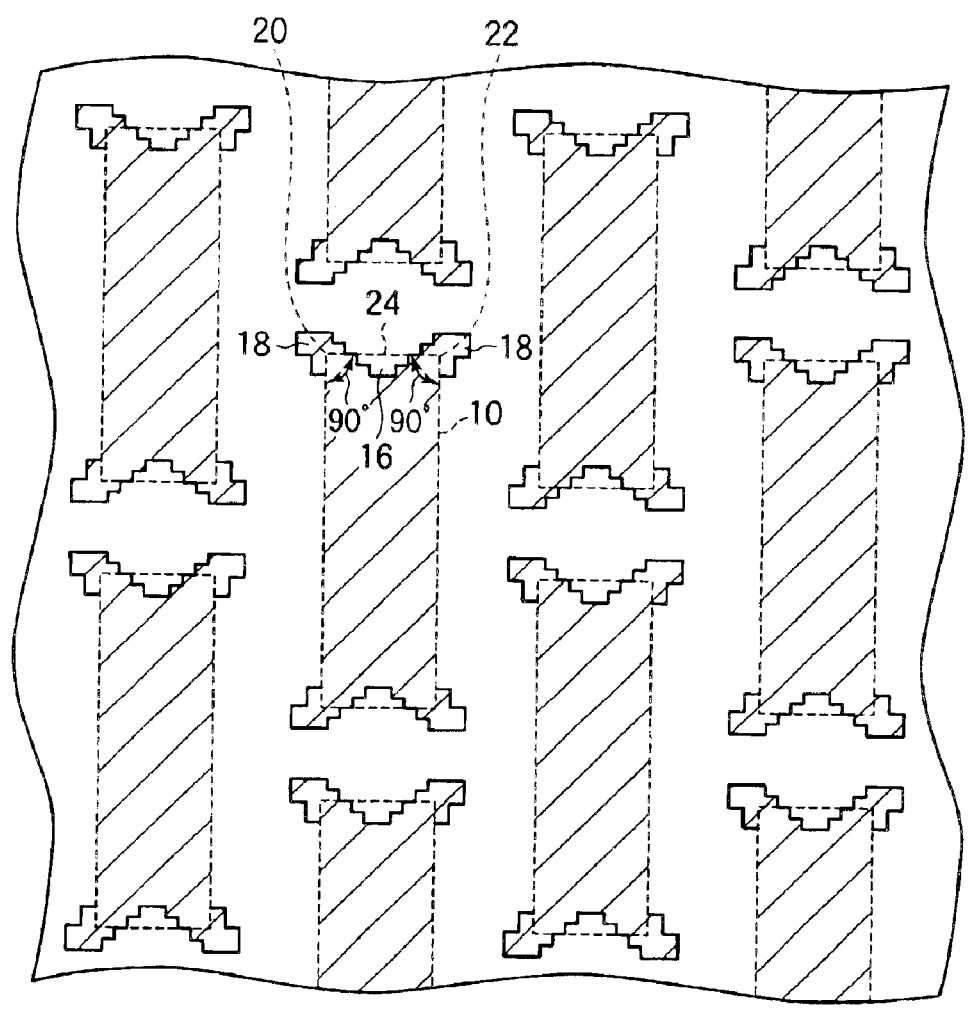
FIG. 7 is a plan view of a mask pattern illustrating a correction method according to a second embodiment of the invention.
Figure 8:
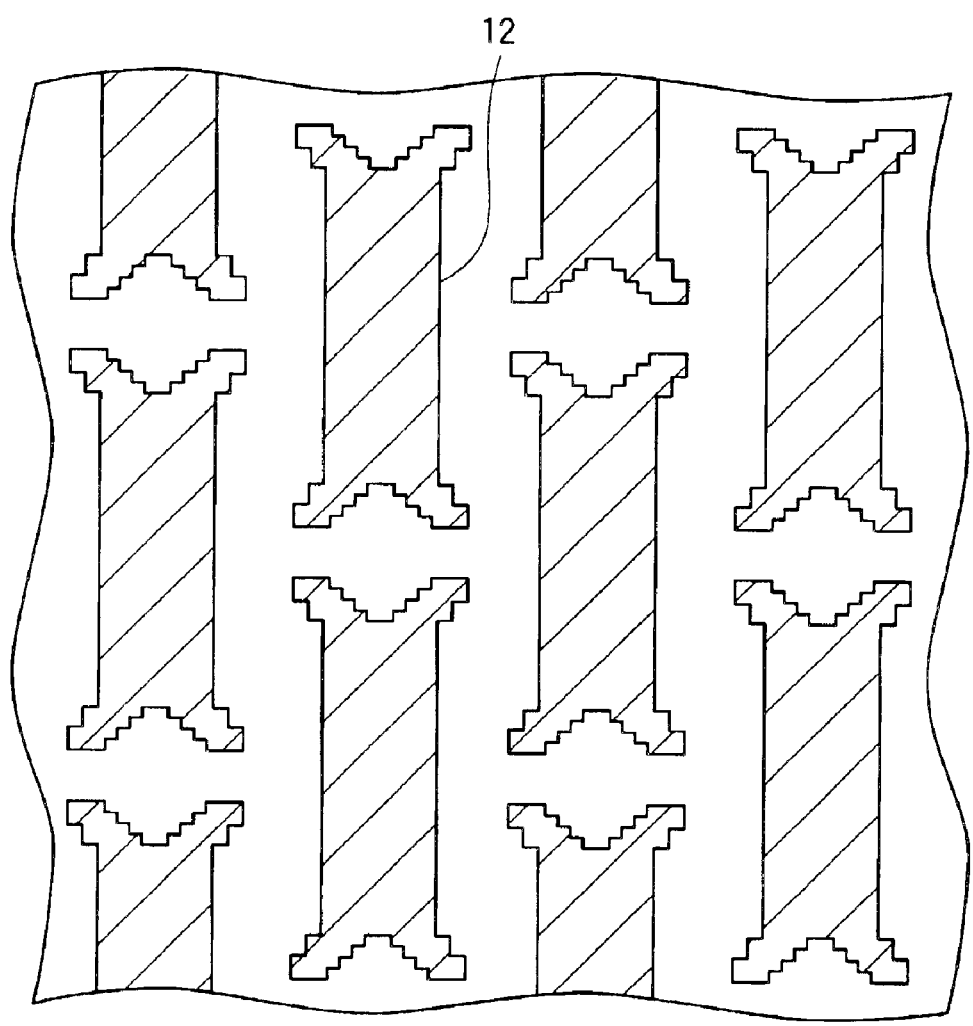
FIG. 8 is a plan view of the corrected mask pattern in FIG. 7.

The second embodiment reverses the transparency and opacity relationships of the first embodiment. Referring to FIG. 7, the main mask pattern 10 in the second embodiment comprises a plurality of opaque rectangles. The interior angles at the corners 20, 22 of the opaque rectangles are ninety degrees, these angles now being the angles in the opaque part of the mask pattern. The second embodiment adds inner serifs 16 to the short edges 24 of the opaque rectangles, and adds outer serifs 18 to the corners 20, 22 of the opaque rectangles. The corrected mask pattern 12 is shown in FIG. 8.

Figure 9:
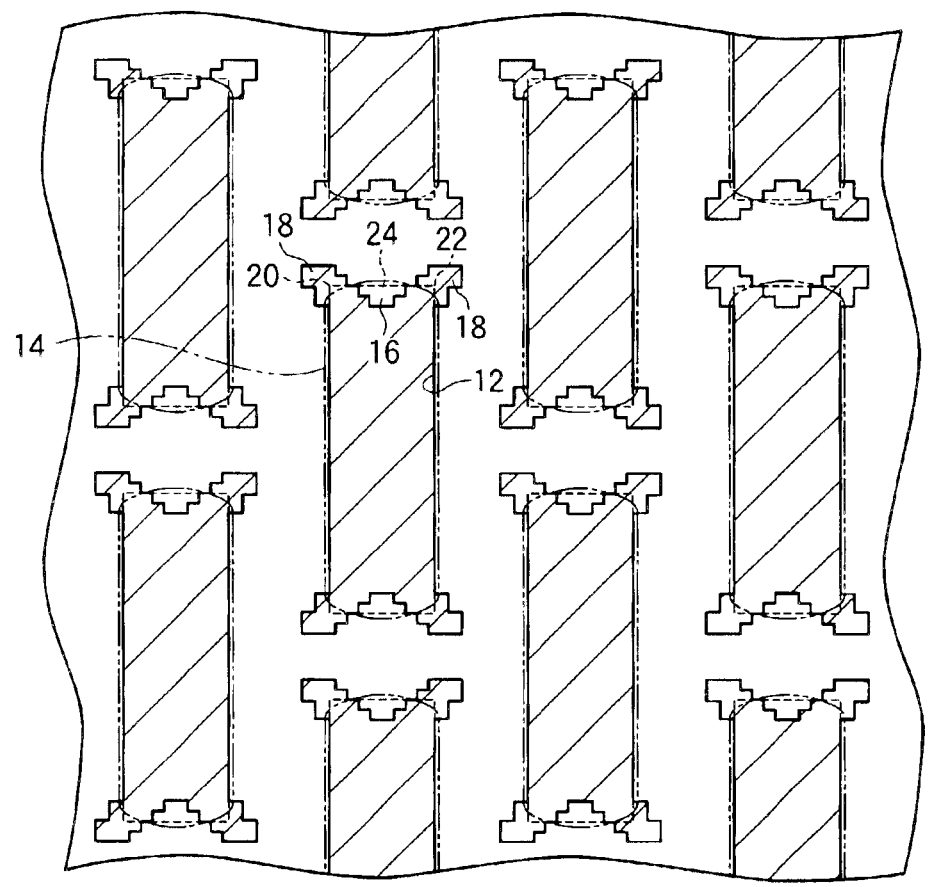
FIG. 9 is a plan view illustrating the transfer of the corrected mask pattern in FIG. 8 to a photoresist layer.
Figure 10:
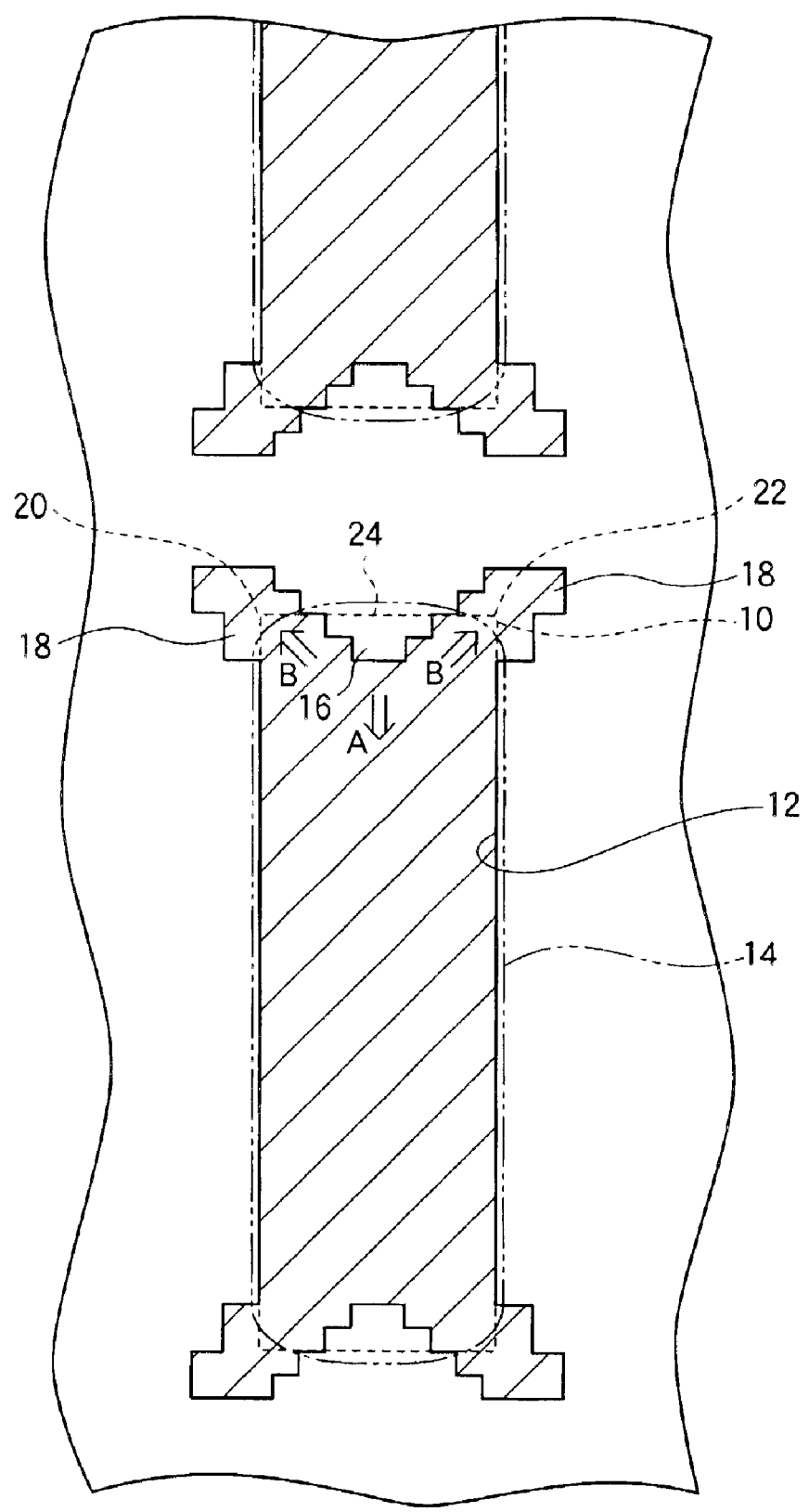
FIG. 10 is an enlarged plan view of part of FIG. 9.

Referring to FIGS. 9 and 10, when photolithography is performed using a photomask having the corrected mask pattern 12 of the second embodiment, the inner serifs 16 bring the short edges of the rectangles in the resist pattern 14 inward, in the direction of arrow A in FIG. 10, and the outer serifs 18 move the corners of the resist pattern 14 outward, in the direction of the arrows marked B. As a result, the shape of the rectangles in the resist pattern 14 closely follows the intended rectangular shape of the main mask pattern 10.

Figure 11:
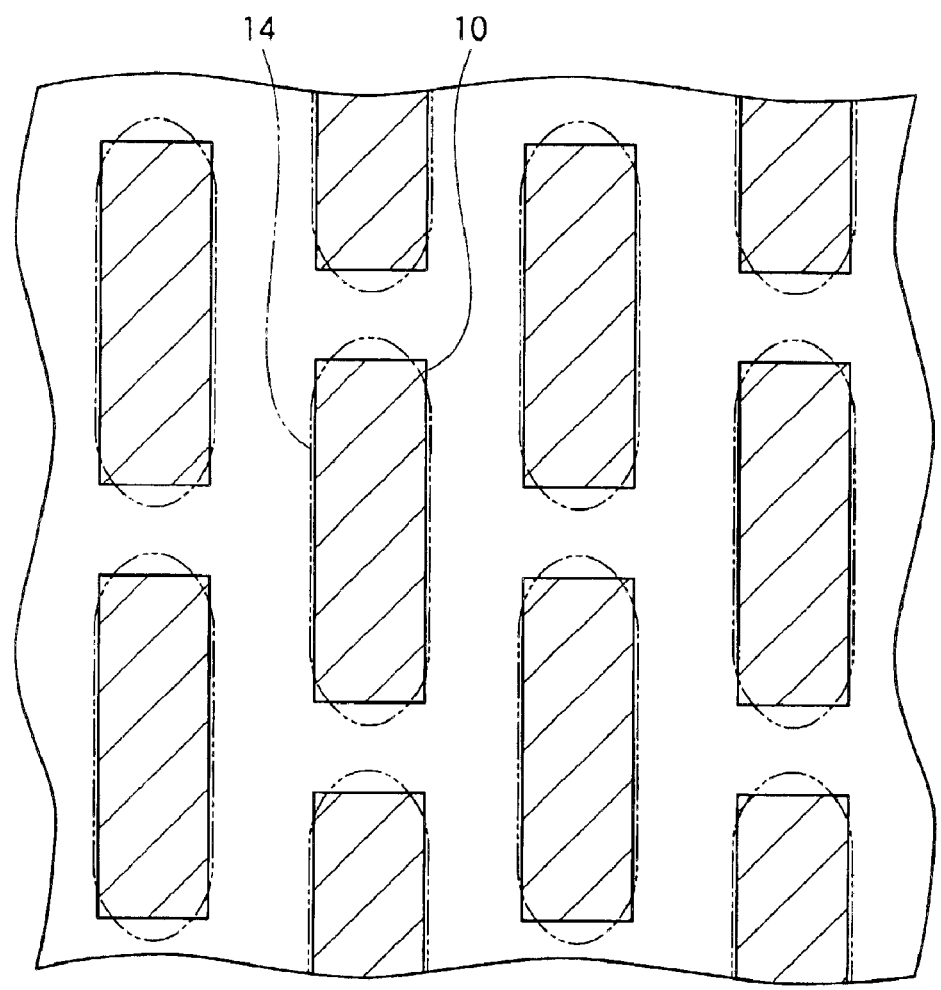
FIG. 11 is a plan view illustrating the transfer of the uncorrected main mask pattern in FIG. 7 to the photoresist layer.
Figure 12:
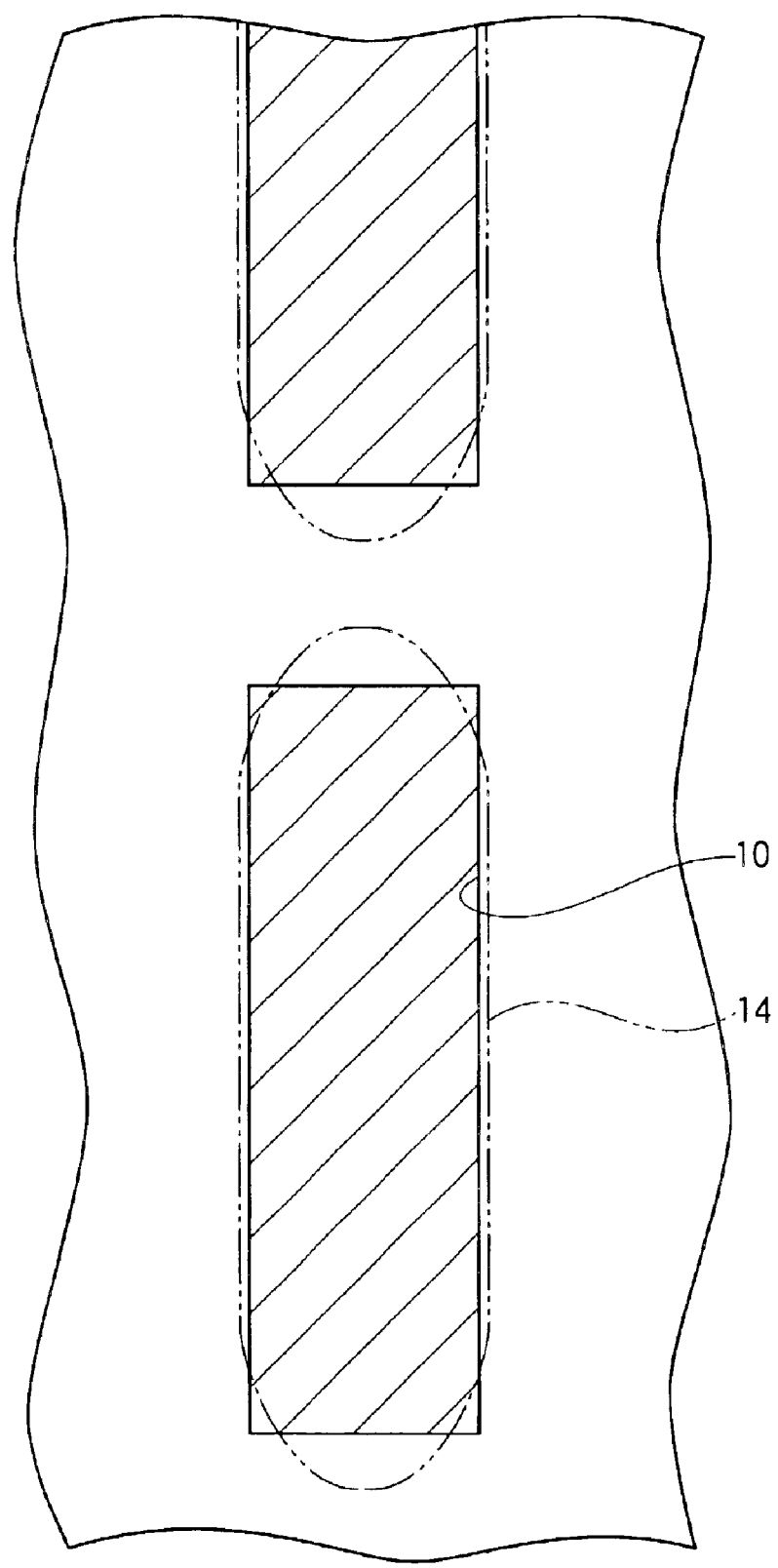
FIG. 12 is an enlarged plan view of part of FIG. 11.

FIGS. 11 and 12 show the resist pattern 14 that would be formed by use of the uncorrected main mask pattern 10, which is now indicated by solid lines. The resist pattern 14 is rounded at the corners and ends, the rounded ends projecting considerably beyond the intended ends of the rectangles. Active regions formed using this resist pattern 14 will be larger than intended, and the spaces between facing ends of adjacent active regions will be more narrow than intended.

Third Embodiment

Figure 13:
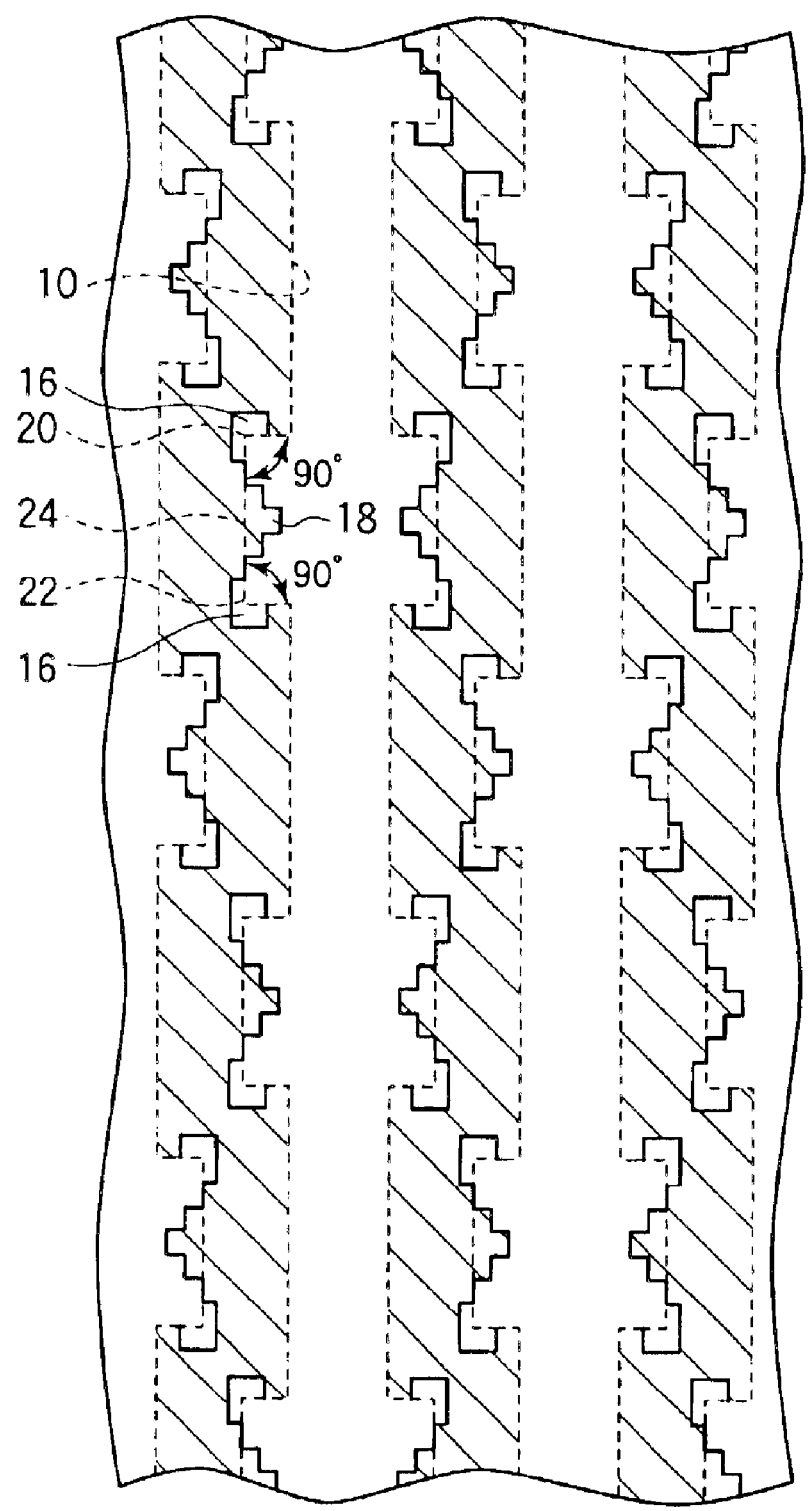
FIG. 13 is a plan view of a mask pattern illustrating a correction method according to a third embodiment of the invention.
Figure 14:
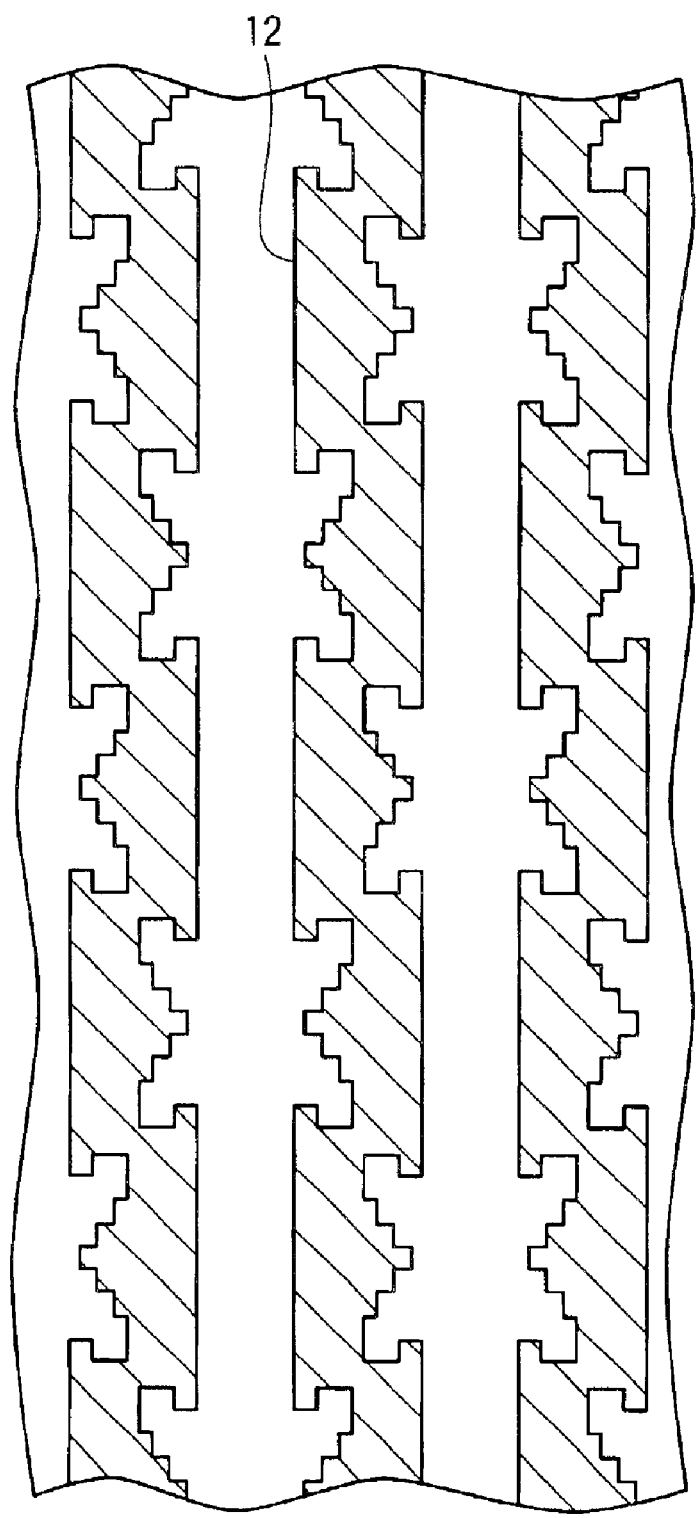
FIG. 14 is a plan view of the corrected mask pattern in FIG. 13.

The third embodiment will be described in relation to the mask pattern of a photomask used to define the gates of transistors in a semiconductor ROM. Referring to FIG. 13, the main mask pattern 10 is a staggered pattern of transparent rectangles (or squares) linked by an overlapping pattern of long, thin parallel transparent slits. To correct the mask pattern, inner serifs 16 are formed at the corners 20, 22 of the transparent rectangles. In contrast to the preceding embodiments, the inner serifs 16 have a single-step shape instead of a two-step shape. A two-step outer serif 18 is formed on each complete edge 24 of each transparent rectangle, between the corners 20, 22. The corners 20, 22 have interior angles of ninety degrees, these being the angles within the transparent part of the mask pattern. The corrected mask pattern 12 is shown in FIG. 14.

Figure 15:
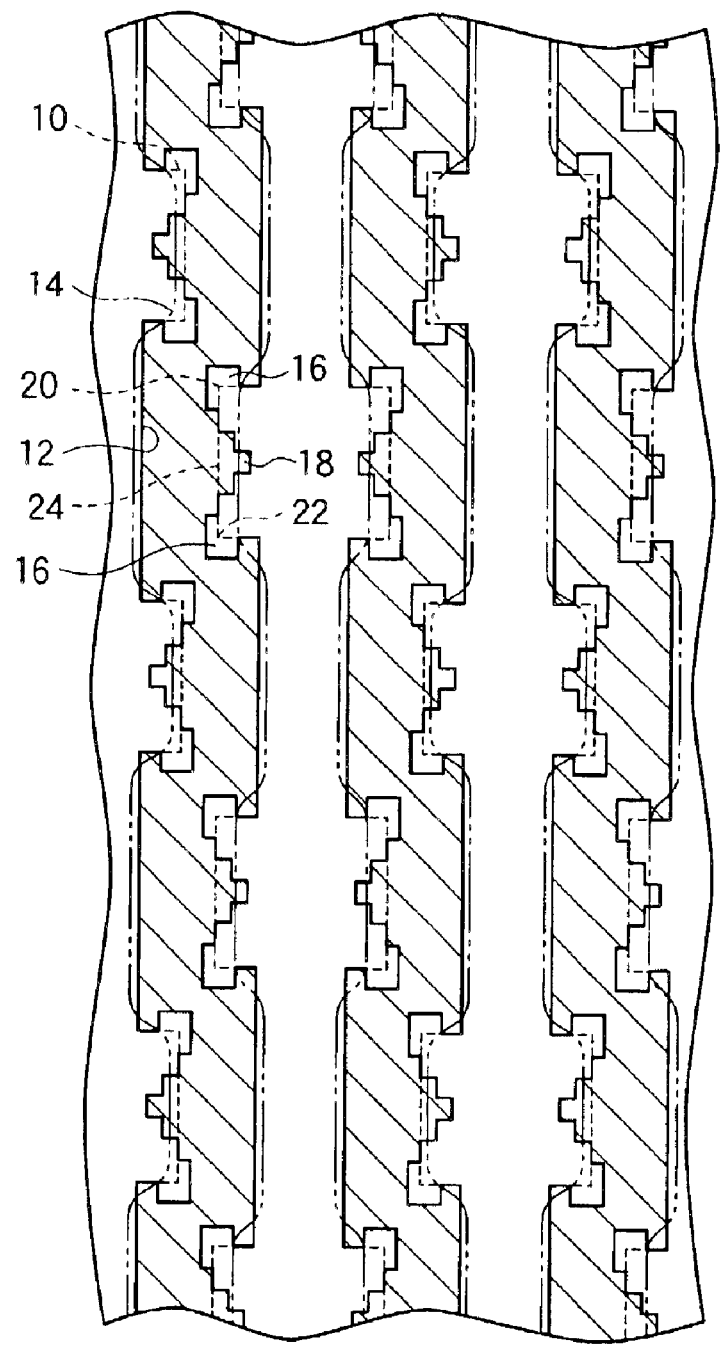
FIG. 15 is a plan view illustrating the transfer of the corrected mask pattern in FIG. 14 to a photoresist layer.
Figure 16:
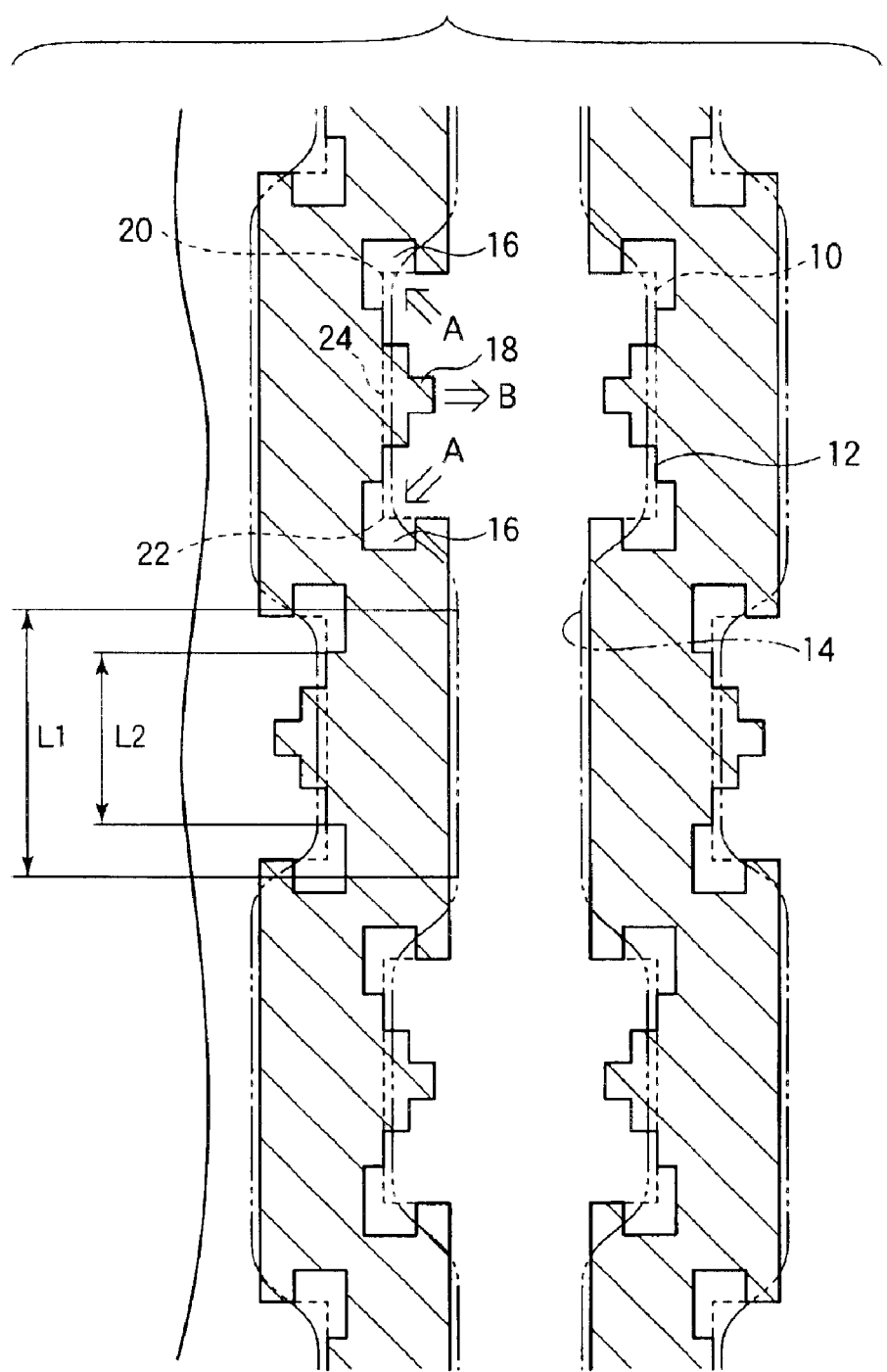
FIG. 16 is an enlarged plan view of part of FIG. 15.

When photolithography is performed using a photomask with the corrected mask pattern 12 in the third embodiment, the resulting resist pattern 14 has the shape shown in FIGS. 15 and 16, including straight segments of length L1 in the spaces between the transparent rectangles and of length L2 at the interior edges of the transparent rectangles. As in the preceding embodiments, the inner serifs 16 push the corners of the resist pattern 14 outward, in the direction of the arrows marked A in FIG. 16, while the outer serif 18 pushes the edge between the corners in the opposite direction, indicated by arrow B.

Figure 17:
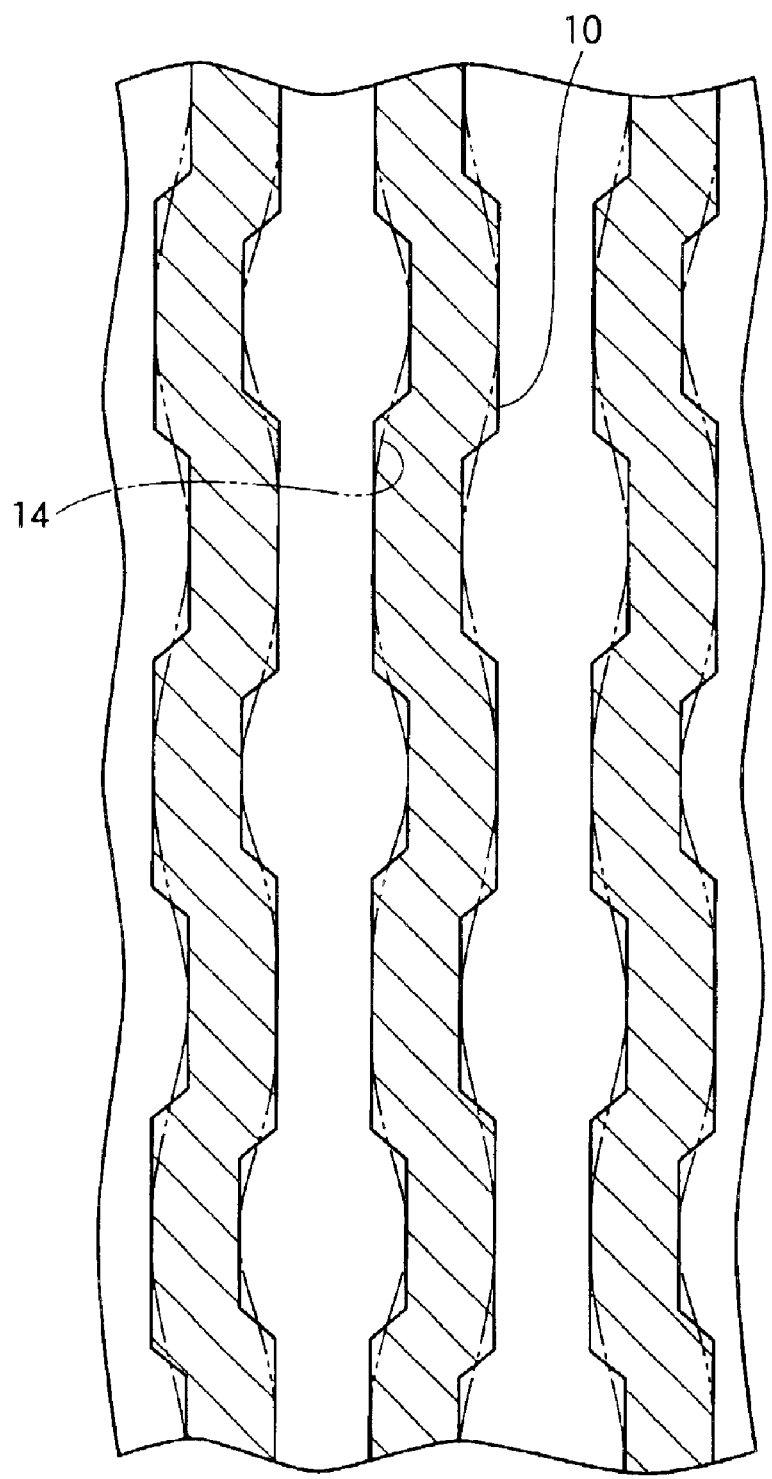
FIG. 17 is a plan view illustrating the transfer of the uncorrected main mask pattern in FIG. 13 to the photoresist layer.
Figure 18:
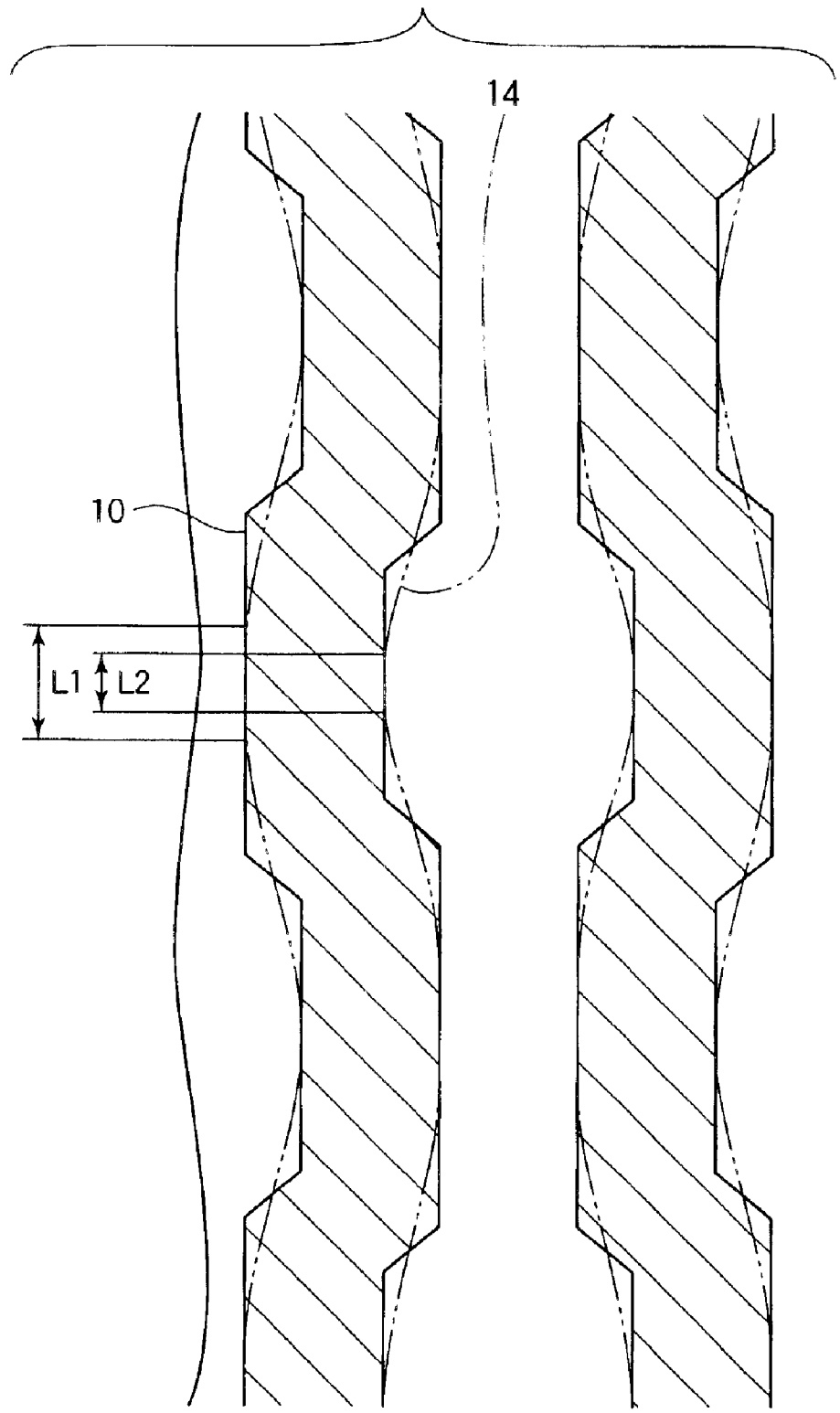
FIG. 18 is an enlarged plan view of part of FIG. 17.

FIGS. 17 and 18 show the resist pattern 14 that would be formed by the use of a main mask pattern 10 (now indicated by solid lines) that has not been corrected by the addition of serifs. This main mask pattern 10 differs from the one in FIGS. 15 and 16 in that the corner angles differ from ninety degrees. Although the difference might be expected to affect mainly dimension L1, in fact, as shown in FIG. 18, both dimensions L1 and L2 are severely reduced, the straight segments of the resist pattern 14 becoming very short both within and between the transparent rectangles. The resist pattern 14 has a highly rounded meandering shape, which is not suitable for the formation of transistor gates.

The effect of the inner serifs and outer serifs in the third embodiment is similar to that in the preceding embodiments. The serifs interact to reduce the rounding of the corners. As a result, the resist pattern has longer straight edges and follows the desired main mask pattern more closely. Gates of the desired width and length can be formed in the straight segments of the resist pattern.

The corners 20, 22 in FIGS. 13 to 16 are not restricted to interior angles of ninety degrees, but the interior angles are preferably between forty-five degrees and one hundred thirty-five degrees.

Fourth Embodiment

Figure 19:
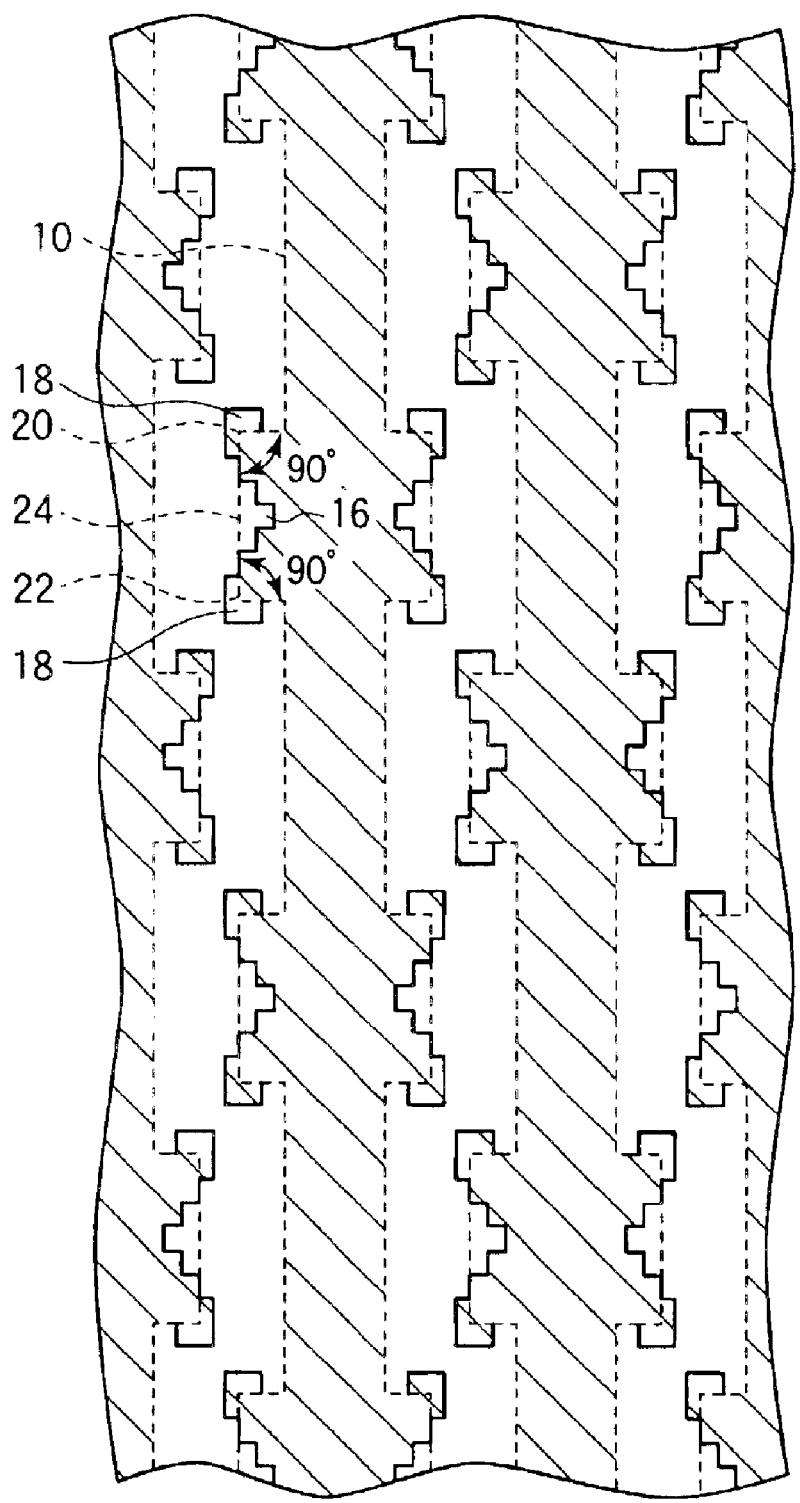
FIG. 19 is a plan view of a mask pattern illustrating a correction method according to a fourth embodiment of the invention.
Figure 20:
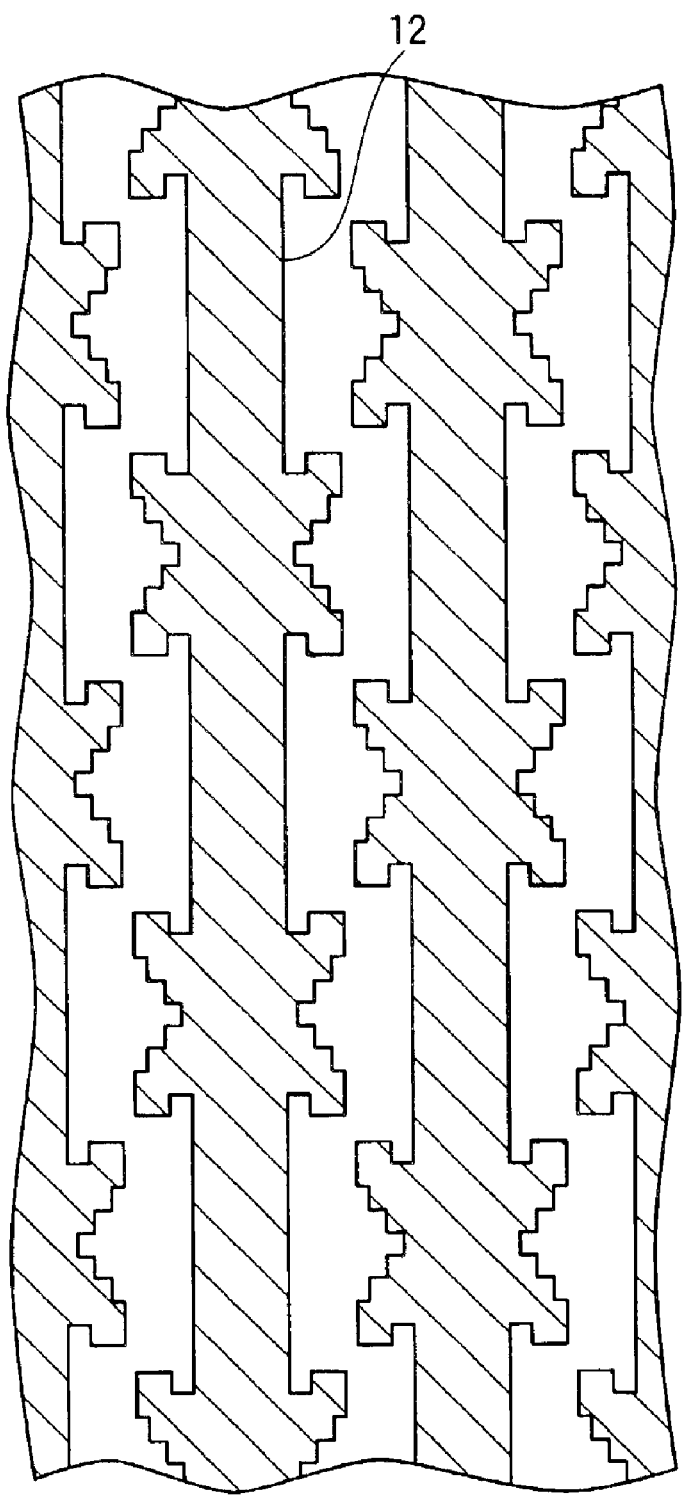
FIG. 20 is a plan view of the corrected mask pattern in FIG. 19.

The fourth embodiment reverses the transparency and opacity relationships of the third embodiment. Referring to FIG. 19, the main mask pattern 10 in the fourth embodiment is a pattern of parallel opaque lines with periodic rectangular (or square) widenings. Outer serifs 18 are formed at the corners 20, 22 of the rectangular widenings, and inner serifs 16 are formed at the edges of the rectangular widenings, between the corners 20, 22. The interior angles at the corners 20, 22 are ninety degrees (these being the angles in the opaque part of the pattern). The inner serifs 16 now have two steps, while the outer serifs 18 have a single-step shape. The corrected mask pattern 12 is shown in FIG. 20.

Figure 21:
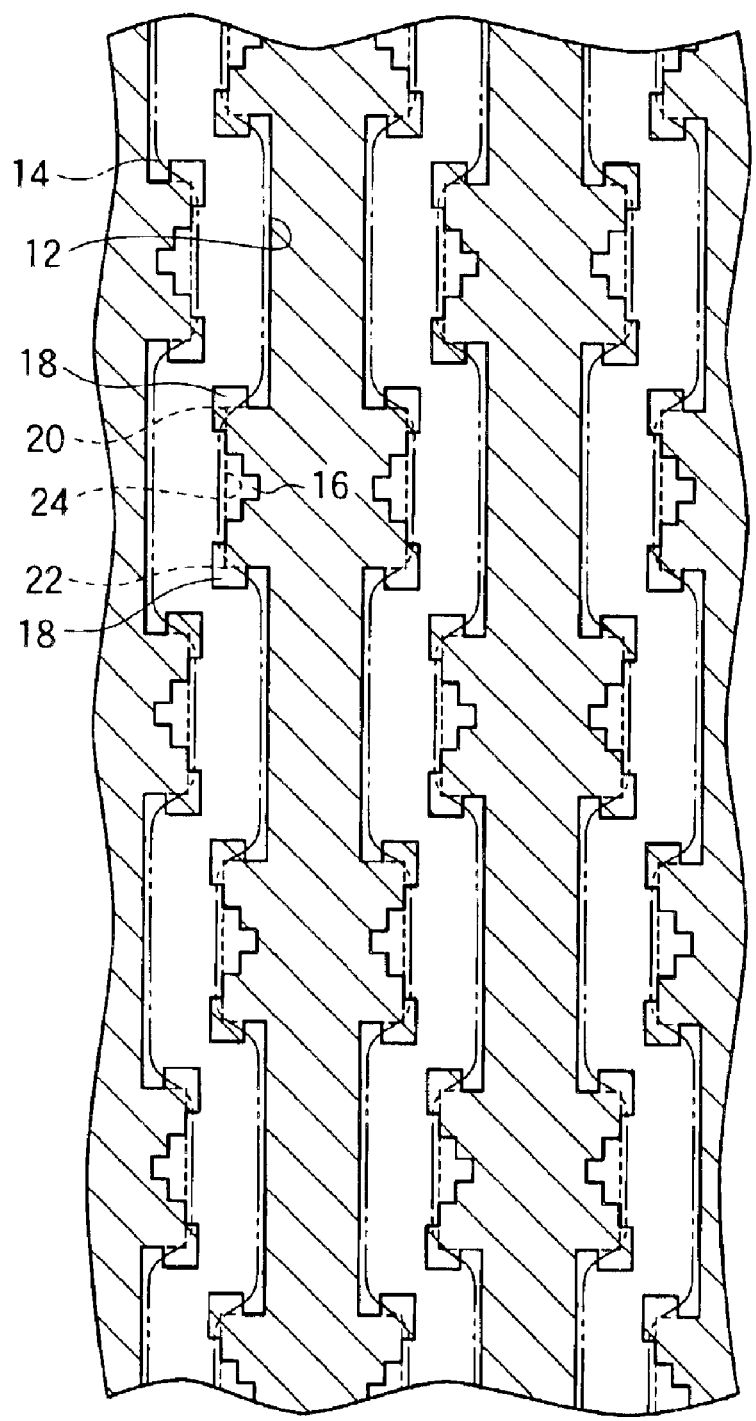
FIG. 21 is a plan view illustrating the transfer of the corrected mask pattern in FIG. 20 to a photoresist layer.
Figure 22:
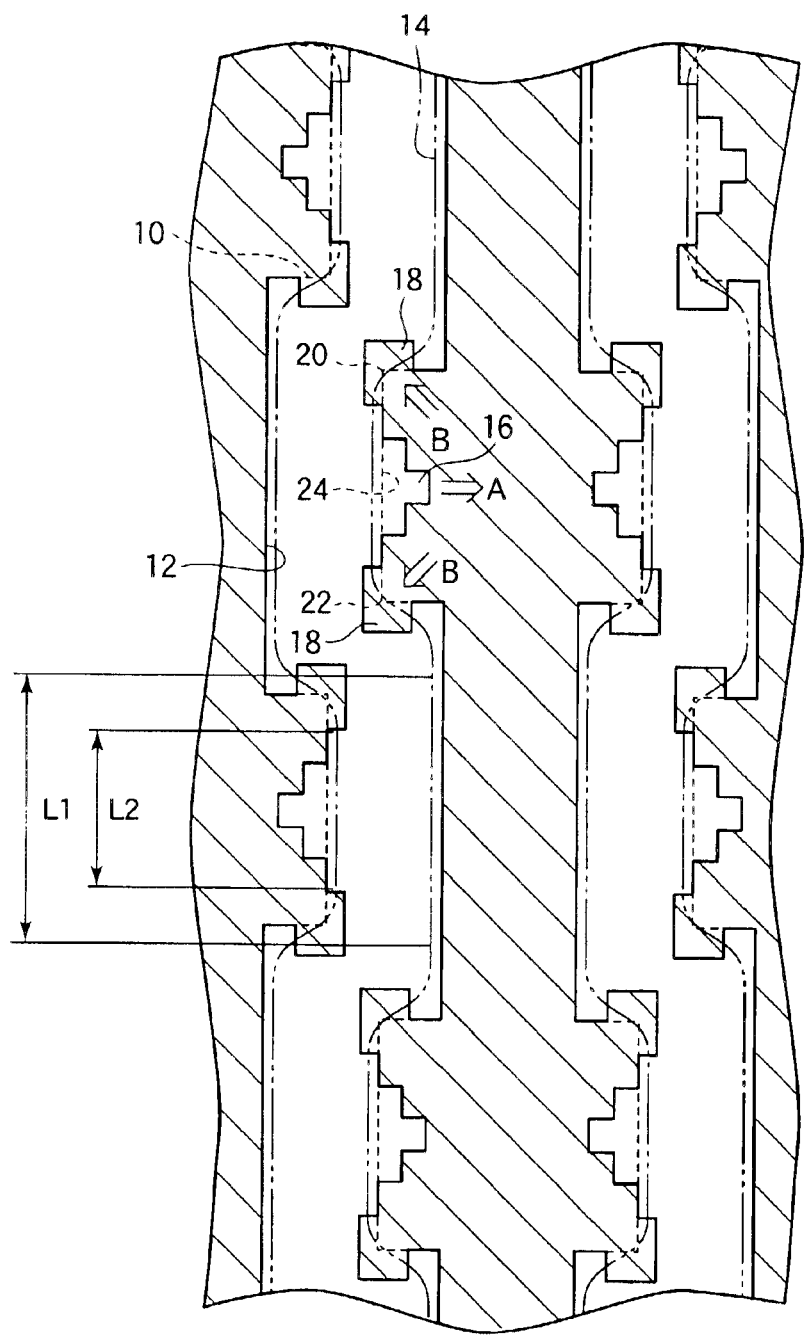
FIG. 22 is an enlarged plan view of part of FIG. 21.

When photolithography is performed using a photomask with the corrected mask pattern 12 in the fourth embodiment, the resulting resist pattern 14 has the shape shown in FIGS. 21 and 22, including straight segments of length L1 in the spaces between the rectangular widenings and of length L2 at the outer edges of the rectangular widenings. The inner serifs 16 push these latter edges inward, in the direction of arrow A in FIG. 22, while the outer serifs 18 push the corners outward, as indicated by the arrows marked B. The edges of the resist pattern 14 are thereby brought closer to the intended edges of the main mask pattern 10, increasing the lengths L1 and L2 of the straight segments of the resist pattern 14.

Figure 23:
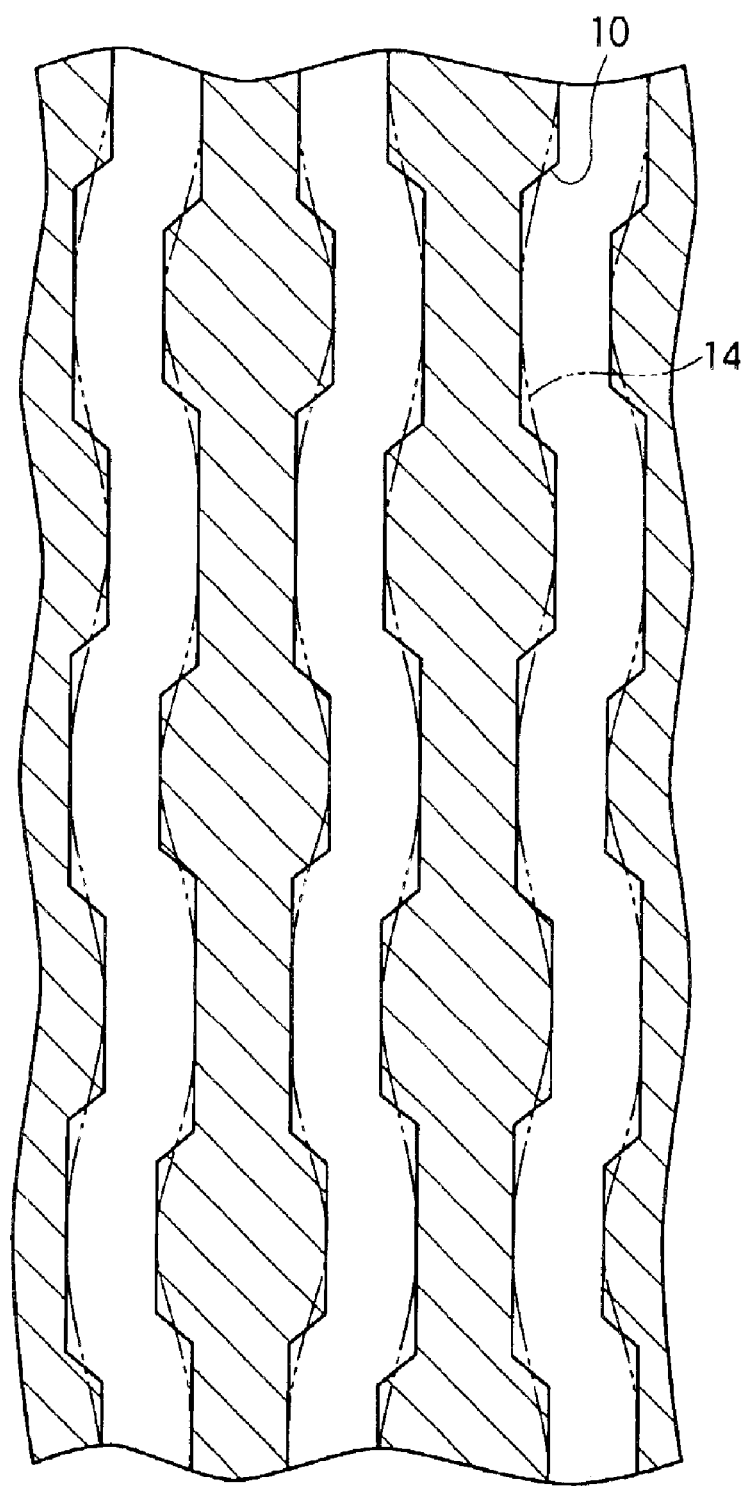
FIG. 23 is a plan view illustrating the transfer of the uncorrected main mask pattern in FIG. 19 to the photoresist layer.
Figure 24:
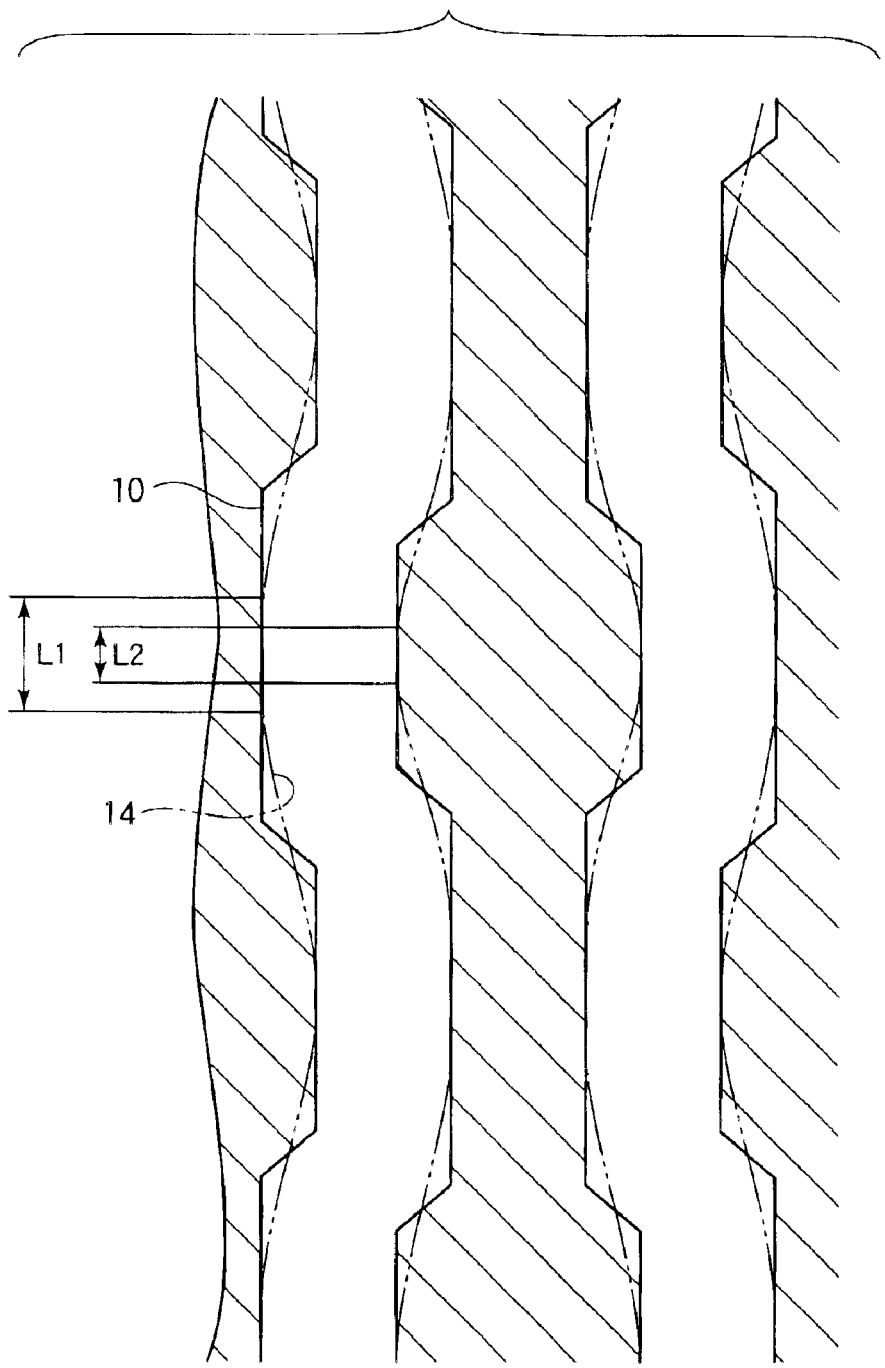
FIG. 24 is an enlarged plan view of part of FIG. 12.

FIGS. 23 and 24 show the resist pattern 14 that would be formed by use of a main mask pattern 10 (now indicated by solid lines) that has not been corrected by the addition of serifs, the corner angles being widened instead. As shown in FIG. 24, lengths L1 and L2 are reduced, as compared with FIG. 22, and the resist pattern 14 has a highly rounded shape.

The effect of the inner serifs and outer serifs in the fourth embodiment is similar to that in the preceding embodiments, reducing the rounding of the corners and producing a resist pattern with longer straight edges.

Fifth Embodiment

Figure 25:
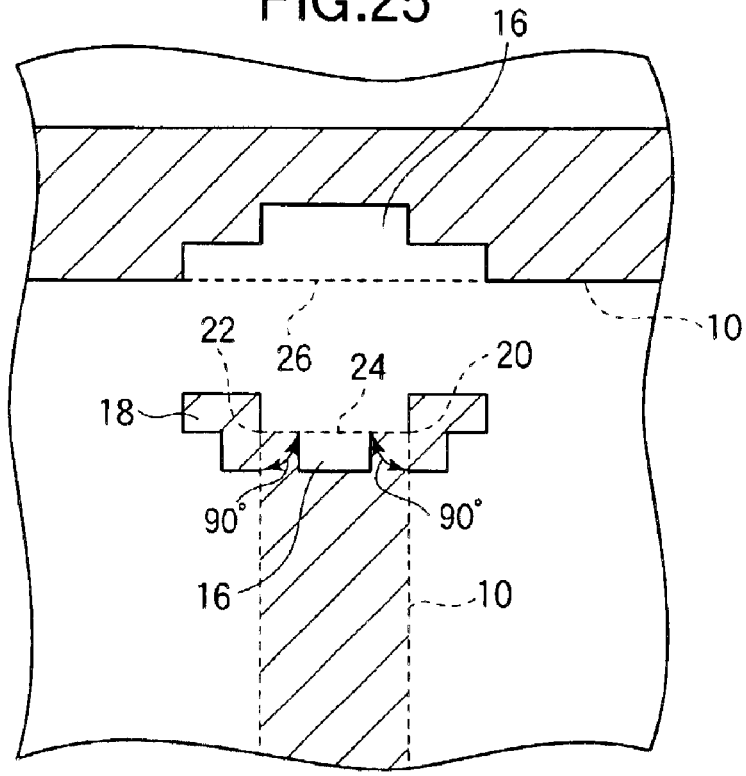
FIG. 25 is a plan view of a mask pattern illustrating a correction method according to a fifth embodiment of the invention.
Figure 26:
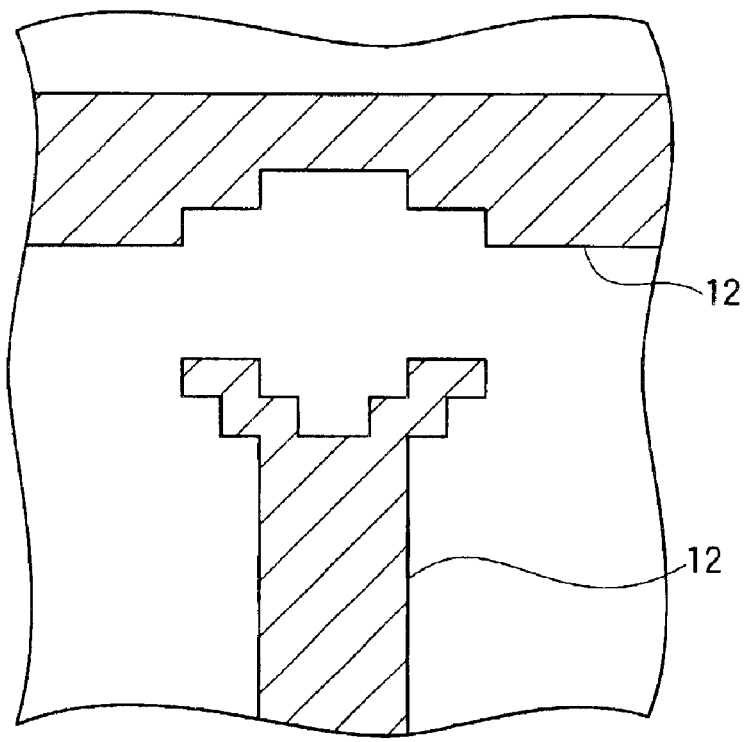
FIG. 26 is a plan view of the corrected mask pattern in FIG. 25.

The main mask pattern in the fifth embodiment includes an opaque line and another opaque region, one end of the opaque line facing a side of the opaque region. In FIG. 25, the other opaque region is also a line. The main mask pattern 10 is corrected by creating an inner serif 16 in the end 24 of the opaque line, and by adding two-step outer serifs 18 at the adjacent corners 20, 22 of the opaque line, where the interior corner angles are ninety degrees. As a further correction, a two-step inner serif 16 is created in the side 26 of the other opaque region, facing the end 24 of the opaque line. The corrected mask pattern 12 is shown in FIG. 26.

Figure 27:
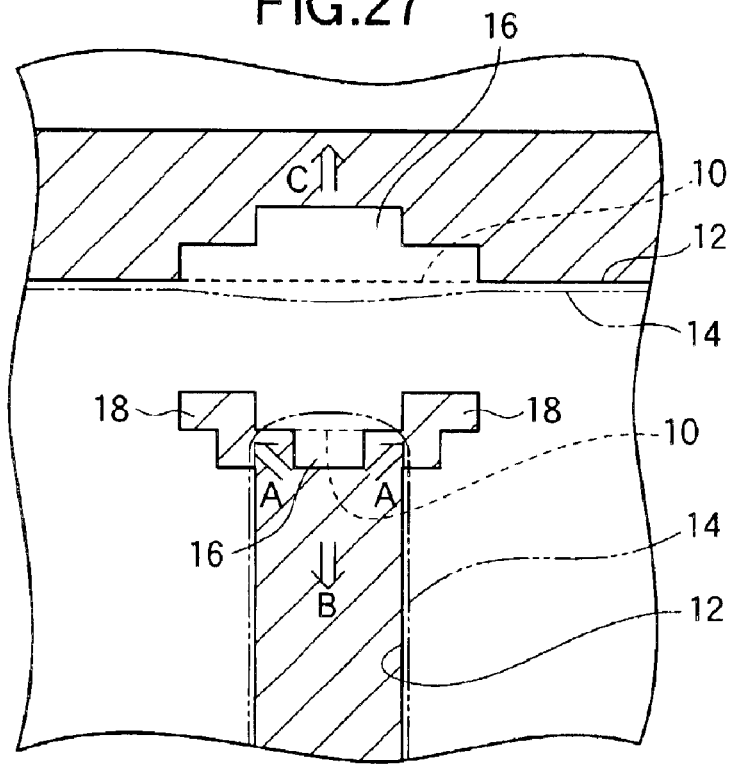
FIG. 27 is a plan view illustrating the transfer of the corrected mask pattern in FIG. 26 to a photoresist layer.

Referring to FIG. 27, when photolithography is performed with a photomask having the corrected mask pattern 12, the serifs 16, 18 added to the opaque line have the same effect as in the second embodiment, pushing the corners of the resist pattern 14 outward in the direction of the arrows marked A and pulling the end of the resist pattern 14 inward, in the direction of arrow B, thereby reducing the rounding of the resist pattern 14 at the end of the line. In addition, the inner serif 16 created in the side of the opaque region facing the end of the opaque line pulls the resist pattern 14 in the direction of arrow C. As a result, the edges of the resist pattern 14 closely follow the intended edges of the main mask pattern 10, both at the end of the line and at the facing side.

Figure 28:
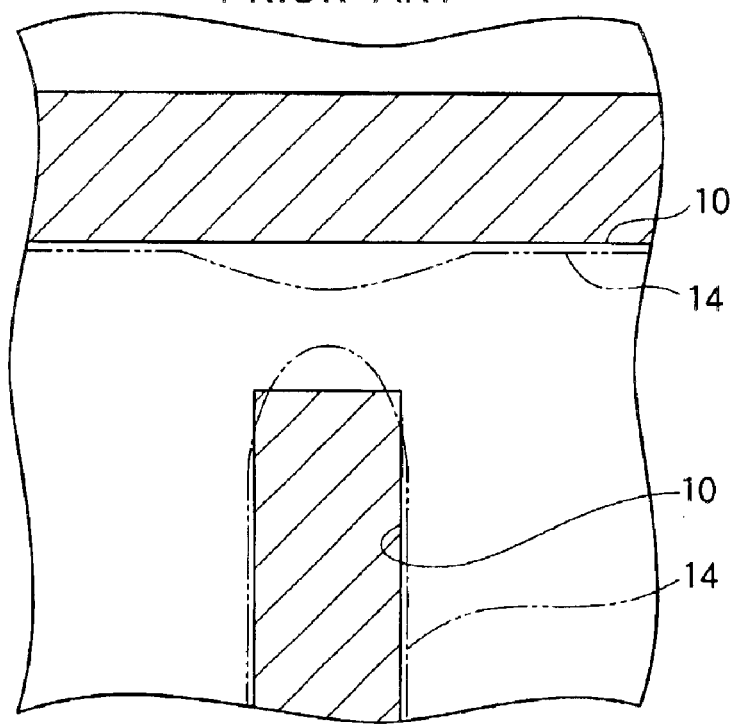
FIG. 28 is a plan view illustrating the transfer of the uncorrected main mask pattern in FIG. 25 to the photoresist layer.

FIG. 28 shows the resist pattern 14 that would be created by photolithography performed with a photomask having the uncorrected main mask pattern 10. Due to the optical proximity effect, the end of the line is severely rounded, and the facing side of the other opaque region bulges out toward the end of the line, greatly reducing the distance between the end of the line and the facing side.

The outer serifs 18 added at the corners 20, 22 of the opaque line in the fifth embodiment differ slightly in shape from the outer serifs added in the second embodiment, to allow for the proximity of the facing side 26 of the other opaque region. As shown in FIG. 27, the result is an almost complete avoidance of any narrowing of the intended space between the two parts of the resist pattern 14.

When semiconductor devices are fabricated, if the method of the present invention is used to correct the main mask patterns of photomasks used in the photolithography steps in the fabrication process, resist patterns closely following the intended patterns are created. Benefits include increased yield of the fabrication process, and improved electrical characteristics of the integrated circuits in the fabricated semiconductor devices.

A particular advantage of using the correction shown in the first or second embodiment for the photomask defining the active regions in a semiconductor device such as a ROM is that, since the rounding of the corners of the active regions is avoided, sufficient contact area is left even if transistor gates are situated near the edges of the active regions. The sizes of the circuit elements in the device can thus be reduced, circuit elements can be placed closer together, and higher levels of device integration can be attained without detriment to electrical characteristics.

One way to reduce the size of a semiconductor device while avoiding unwanted contact between adjacent circuit elements is to form gate electrodes in continuous swerving lines which are straight where the gates overlie the active regions, and swerve alternatively to one side and the other between the active regions. That is, the gate electrode lines follow paths with a crankshaft shape, although the angles at the bends are not limited to ninety degrees. If such gate lines are defined by a photomask with a main mask pattern corrected as in the third or fourth embodiment, the straight sections of the gate lines are lengthened and the lengths of the swerving sections between the straight sections are shortened, so that the active regions can be placed closer together while the straightness of the gate electrodes over the active regions is preserved. Integration levels can therefore be increased while adequate electrical characteristics are maintained.

The invented correction method is thus particularly effective when applied to the fabrication of a semiconductor device having patterns of active regions and gate lines of the general type illustrated in the first and third embodiments. As illustrated by the fifth embodiment, however, the effectiveness of the invented correction method is not restricted to gate lines and active regions.

The invention is not limited to the corrections shown as examples in the preceding embodiments. The shapes of the serifs and the numbers of steps can be varied, as mentioned above, and those skilled in the art will recognize that further variations are possible within the scope of the appended claims.

The invention also provides a photomask having a main mask pattern corrected by the adding serifs as described above, an exposure method including the use of this photomask, and a semiconductor device fabricated by a process employing the invented photomask for photolithography. The photomask may be used to define active regions of the semiconductor device, for example, or to define the gates of transistors.

What is claimed is:

1. A method of correcting a main mask pattern used to create a resist pattern by photolithography, to improve corner morphology of the resist pattern, comprising:
    adding first serifs to two adjacent corners of a part of the main mask pattern; and
    adding a second serif to an edge of said part of the main mask pattern disposed between said two adjacent corners, the second serif extending inward from said edge if the first serifs extend outward from the two adjacent corners, or extending outward from said edge if the first serifs extend inward from the two adjacent corners.

2. The method of claim 1, wherein said part of the main mask pattern is transparent, said first serifs are inner serifs, and said second serif is an outer serif.

3. The method of claim 2, wherein said corners have interior angles less than one hundred eighty degrees.

4. The method of claim 3, wherein said corners have interior angles of from forty-five degrees to one hundred thirty-five degrees.

5. The method of claim 1, wherein said part of the main mask pattern is opaque, said first serifs are outer serifs, and said second serif is an inner serif.

6. The method of claim 5, wherein said corners have interior angles less than one hundred eighty degrees.

7. The method of claim 6, wherein said corners have interior angles of from forty-five degrees to one hundred thirty-five degrees.

8. The method of claim 5, wherein said main mask pattern has another opaque part with a side facing said edge, the method further comprising adding an inner serif to said side, facing the inner serif added to said edge.

9. The method of claim 1, wherein said edge is shorter than other edges of said part of said main mask pattern adjacent to said corners.

10. The method of claim 1, wherein said first serifs are multi-step serifs.

11. The method of claim 1, wherein said second serif is a multi-step serif.

12. The method of claim 10, wherein said second serif is a multi-step serif.

13. The method of claim 1, wherein said part of the main mask pattern is opaque, said first serifs are outer serifs, and said second serif is an inner serif, said corners have interior angles less than one hundred eighty degrees, and said main mask pattern has another opaque part with a side facing said edge, the method further comprising adding an inner serif to said side, facing the inner serif added to said edge.

14. The method of claim 1, wherein said part of the main mask pattern has an opaque meandering shape deviating alternately to one side and another side of a longitudinal axis, said two adjacent corners being disposed at points where one of said part of the main mask pattern deviates toward the longitudinal axis, said edge being parallel to the longitudinal axis and displaced toward the longitudinal axis, said first serifs being inner serifs, said second serif being an outer serif.

15. The method of claim 1, wherein said part of the main mask pattern has a transparent meandering shape deviating alternately to one side and another side of a longitudinal axis, said two adjacent corners being disposed at points where one of said part of the mask pattern deviates toward the longitudinal axis, said edge being parallel to the longitudinal axis and displaced toward the longitudinal axis, said first serifs being outer serifs, said second serif being an inner serif.

* * * * *